United States Patent
Lee et al.

(10) Patent No.: US 12,016,195 B2
(45) Date of Patent: Jun. 18, 2024

(54) DISPLAY DEVICE INCLUDING CORNER DISPLAY HAVING CUTOUTS AND DAMS

(71) Applicant: Samsung Display Co., Ltd., Yongin-si (KR)

(72) Inventors: Hye Min Lee, Gimpo-si (KR); Hyoung Sub Lee, Yongin-si (KR); Jin Ho Hyun, Gwacheon-si (KR); Woo Yong Sung, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 288 days.

(21) Appl. No.: 17/483,629

(22) Filed: Sep. 23, 2021

(65) Prior Publication Data

US 2022/0093897 A1    Mar. 24, 2022

(30) Foreign Application Priority Data

Sep. 24, 2020   (KR) .................. 10-2020-0123541

(51) Int. Cl.
*H10K 50/84* (2023.01)
*H10K 50/844* (2023.01)
(Continued)

(52) U.S. Cl.
CPC ......... *H10K 50/844* (2023.02); *H10K 59/121* (2023.02); *G02F 1/133331* (2021.01);
(Continued)

(58) Field of Classification Search
CPC .. H10K 50/844; H10K 50/80; H10K 50/8426; H10K 50/15; H10K 50/16; H10K 50/17; H10K 50/171; H10K 59/121; H10K 59/122; H10K 59/124; H10K 59/12; H10K 59/40; H10K 59/38; H10K 77/10; H10K 77/111; H10K 2102/211; H10K 2102/351;
(Continued)

(56) References Cited

U.S. PATENT DOCUMENTS 10,411,083 B2 * 9/2019 Song ............... H10K 59/1213
10,770,015 B2 * 9/2020 Lee ....................... G09G 3/3677
(Continued)

FOREIGN PATENT DOCUMENTS

CN         108766977 A  * 11/2018  ............ G09F 9/301
KR    10-2019-0029487         3/2019
(Continued)

*Primary Examiner* — Ida M Soward
(74) *Attorney, Agent, or Firm* — KILE PARK REED & HOUTTEMAN PLLC

(57) ABSTRACT

A display device includes: a display panel having a front portion, a first bending portion, a second bending portion, and a corner portion, the display panel including a plurality of first pixels disposed in the front portion and a plurality of second pixels disposed in the corner portion. The display panel includes: a substrate; a first dam surrounding the plurality of first pixels; and a second dam surrounding the plurality of second pixels. The substrate includes a plurality of cutout patterns disposed in the corner portion, the plurality of second pixels and the second dam are disposed in each of the plurality of cutout patterns, and a height of an upper surface of the first dam is higher than a height of an upper surface of the second dam, based on one surface of the substrate.

20 Claims, 19 Drawing Sheets

(51) Int. Cl.
    *H10K 59/12*    (2023.01)
    *H10K 59/121*    (2023.01)
    *G02F 1/1333*    (2006.01)
    *G06F 1/16*    (2006.01)
    *G09F 9/30*    (2006.01)
    *H10K 50/15*    (2023.01)
    *H10K 50/16*    (2023.01)
    *H10K 50/17*    (2023.01)
    *H10K 59/38*    (2023.01)
    *H10K 59/40*    (2023.01)
    *H10K 102/00*    (2023.01)

(52) U.S. Cl.
CPC ............ *G06F 1/1652* (2013.01); *G09F 9/301* (2013.01); *G09G 2380/02* (2013.01); *H05K 2201/09909* (2013.01); *H10K 50/15* (2023.02); *H10K 50/16* (2023.02); *H10K 50/17* (2023.02); *H10K 50/171* (2023.02); *H10K 59/38* (2023.02); *H10K 59/40* (2023.02); *H10K 2102/311* (2023.02)

(58) Field of Classification Search
CPC ........ H05K 2201/09909; G06F 1/1652; G09F 9/301; G09G 2380/02; G02F 1/133331
See application file for complete search history.

(56) References Cited

U.S. PATENT DOCUMENTS

| | | | | |
|---|---|---|---|---|
| 2019/0181363 | A1* | 6/2019 | Lee | H10K 50/828 |
| 2019/0269011 | A1* | 8/2019 | Lee | H05K 3/0014 |
| 2020/0170126 | A1* | 5/2020 | Ahn | H10K 59/353 |
| 2020/0212115 | A1* | 7/2020 | Choi | H10K 50/86 |
| 2020/0328382 | A1* | 10/2020 | Lee | H10K 50/854 |
| 2020/0342816 | A1* | 10/2020 | Bok | H10K 59/40 |
| 2021/0111371 | A1* | 4/2021 | Cho | H10K 59/121 |

FOREIGN PATENT DOCUMENTS

| | | | |
|---|---|---|---|
| KR | 10-2020-0042029 | 4/2020 | |
| KR | 10-2021-0127281 | 10/2021 | |
| WO | WO-2019223776 A1 * | 11/2019 | ............. G09F 9/301 |

* cited by examiner

DISL : TFTL,EML,TFEL
LEL1 : 171,172,173
PX1 : ST1,LEL1

DISPLAY DEVICE INCLUDING CORNER DISPLAY HAVING CUTOUTS AND DAMS

CROSS REFERENCE TO RELATED APPLICATION

This application claims priority from and the benefit of Korean Patent Application No. 10-2020-0123541 filed on Sep. 24, 2020, which is hereby incorporated by reference for all purposes as if fully set forth herein.

BACKGROUND

Field

Embodiments of the invention relate generally to a display device and more specifically, to a display device having a curved display panel with dam patterns.

Discussion of the Background

With the development of the information society, demands for display devices for displaying images have increased in various forms. For example, display devices have been applied to various electronic appliances such as smart phones, digital cameras, notebook computers, navigation systems, and smart televisions.

Examples of display devices include light receiving display devices such as a liquid crystal display device and a field emission display device, and light emitting display devices such as an organic light emitting display device including an organic light emitting element, an inorganic light emitting display device including an inorganic light emitting element such as an inorganic semiconductor, and a micro light emitting display device including a micro light emitting element.

As display devices are applied to various electronic devices, display devices having various designs are required. For example, a display device may display an image on a front portion, on bending portions bent at four edges, and on corner portions between the bending portions.

The above information disclosed in this Background section is only for understanding of the background of the inventive concepts, and, therefore, it may contain information that does not constitute prior art.

SUMMARY

Applicant has discovered that a display device with a display panel may have defects due to damage to dam structures of the display panel caused by mask imprinting.

Display devices constructed according to the principles of the invention are capable of preventing the defects caused by the damage to the dam structure of the display devices. According to a display device according to an embodiment, it is possible to suppress or prevent defects from occurring due to mask imprinting of a dam structure.

Additional features of the inventive concepts will be set forth in the description which follows, and in part will be apparent from the description, or may be learned by practice of the inventive concepts.

According to an aspect of the invention, a display device includes: a display panel having a front portion, a first bending portion extending from a first side of the front portion, a second bending portion extending from a second side of the front portion, and a corner portion disposed between the first bending portion and the second bending portion, the display panel including a plurality of first pixels disposed in the front portion and a plurality of second pixels disposed in the corner portion, wherein the display panel including: a substrate; a first dam disposed on the substrate and surrounding the plurality of first pixels; and a second dam disposed on the substrate and surrounding the plurality of second pixels, wherein the substrate includes a plurality of cutout patterns disposed in the corner portion, at least some of the plurality of cutout patterns being separated from each other, the plurality of second pixels and the second dam are disposed in each of the plurality of cutout patterns, and a height of an upper surface of the first dam is higher than a height of an upper surface of the second dam, based on one surface of the substrate.

The first dam may include a plurality of first unit patterns and a plurality of second unit patterns, and wherein: the plurality of first unit patterns may be repeatedly arranged and spaced apart from each other, and the plurality of second unit patterns may be repeatedly arranged and spaced apart from each other.

The plurality of first unit patterns and the plurality of second unit patterns may be arranged in substantially parallel.

Each of the first unit patterns and the second unit patterns may have a rectangular shape or a hexagonal shape.

The display device may further include a connection dam disposed on the substrate and connecting the second dam respectively disposed in the plurality of cutout patterns.

The display device may further include an organic encapsulation layer including: a first organic layer disposed on the plurality of first pixels and covering the plurality of first pixels, and a second organic layer disposed on the plurality of second pixels and covering the plurality of second pixels, wherein the first organic layer may overlap the first dam and the second dam.

The first organic layer may cover an entire area of the first dam, and fills an area between the first dam and the second dam.

A thickness of the first organic layer may be greater than a thickness of the second organic layer.

The thickness of the first organic layer may be in a range of about 7 μm to about 9 μm, and the thickness of the second organic layer is in a range of about 3 μm to about 5 μm.

Each of the first dam and the second dam may have an under-cut shape.

The first bending portion may have a first curvature, the second bending portion may have a second curvature, and the corner portion may have a double curvature bent by the first curvature and the second curvature.

The first curvature may be different from the second curvature.

According to another aspect of the invention, a display device includes: a display panel having a front portion, a first bending portion extending from a first side of the front portion, a second bending portion extending from a second side of the front portion, and a corner portion disposed between the first bending portion and the second bending portion, the display panel including a plurality of first pixels disposed in the front portion and a plurality of second pixels disposed in the corner portion, wherein the display panel includes: a substrate; a first dam disposed on the substrate and surrounding the plurality of first pixels; a second dam disposed on the substrate and surrounding the plurality of second pixels; and an organic encapsulation layer including a first organic layer disposed on the plurality of first pixels and covering the plurality of first pixels, and a second organic layer disposed on the plurality of second pixels and covering the plurality of second pixels, wherein the substrate includes a plurality of cutout patterns disposed in the corner portion and at least some thereof being separated from each other, the plurality of second pixels and the second dam are disposed in each of the cutout patterns, and the first organic layer overlaps the first dam and the second dam.

The first organic layer may cover an entire area of the first dam, and may fill an area between the first dam and the second dam.

A thickness of the first organic layer may be in a range of about 7 µm to about 9 µm, and a thickness of the second organic layer is in a range of about 3 µm to about 5 µm.

A height of an upper surface of the first dam may be higher than a height of an upper surface of the second dam, based on one surface of the substrate.

The first dam may include a plurality of first unit patterns and a plurality of second unit patterns, and wherein: the plurality of first unit patterns may be repeatedly arranged, and the plurality of second unit patterns may be repeatedly arranged.

The display device may further include a connection dam disposed on the substrate and connecting the second dam respectively disposed in the plurality of cutout patterns.

According to another aspect of the invention, a display device includes: a substrate having a base portion and a plurality of cutout patterns protruding from the base portion; a plurality of first pixels disposed on the base portion; a plurality of second pixels disposed in each of the cutout patterns; a first dam disposed on the base portion and surrounding the plurality of first pixels; and a second dam disposed in each of the plurality of cutout patterns and surrounding the plurality of second pixels, wherein a height of an upper surface of the first dam is higher than a height of an upper surface of the second dam, based on one surface of the substrate.

The display device may further include an organic encapsulation layer including: a first organic layer disposed on the plurality of first pixels and covering the plurality of first pixels, and a second organic layer disposed on the plurality of second pixels and covering the plurality of second pixels, wherein the first organic layer may overlap the first dam and the second dam.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
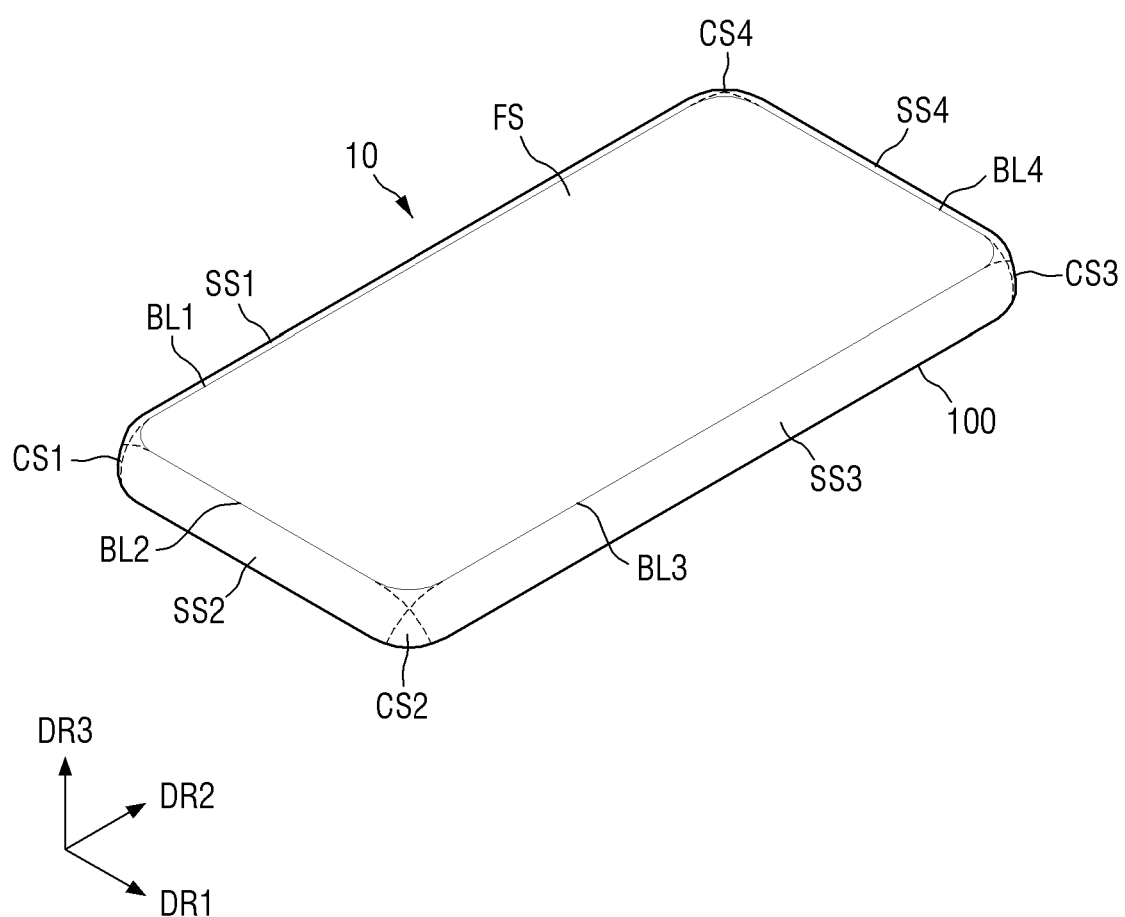
FIG. 1 is a perspective view of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "haves," "having," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the present invention will be described with reference to the attached drawings.

Figure 2:
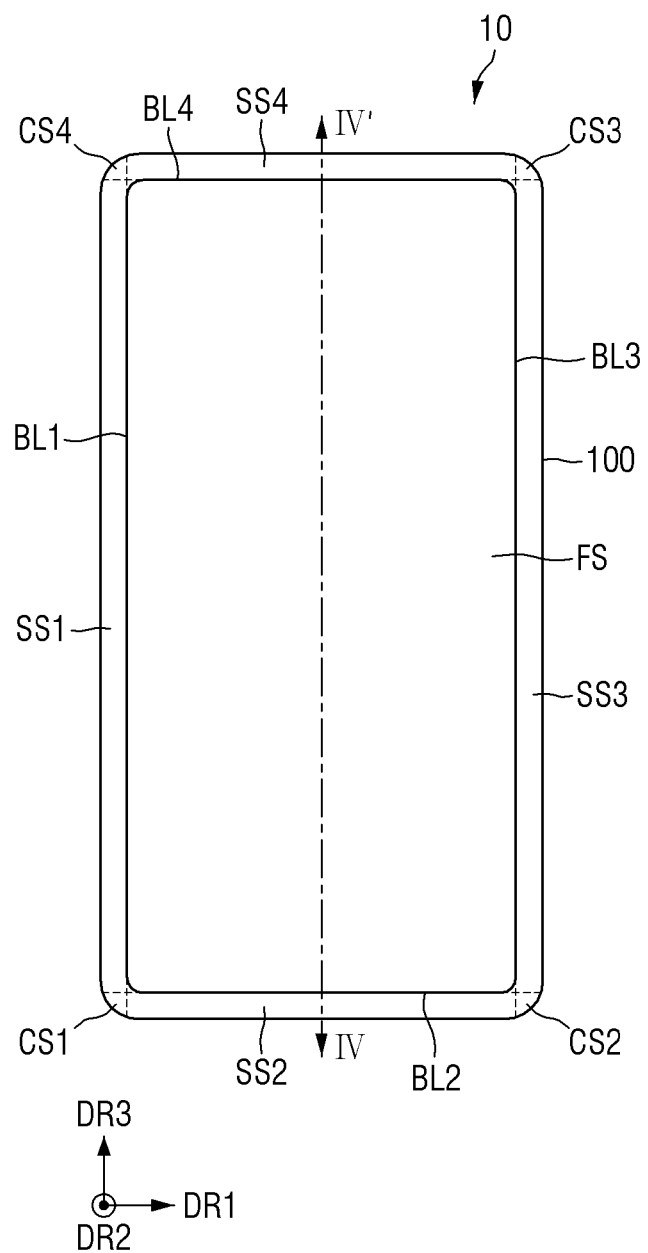
FIG. 2 is a plan view of the display device of FIG. 1.

FIG. 1 is a perspective view of an embodiment of a display device constructed according to the principles of the invention. FIG. 2 is a plan view of the display device of FIG. 1.

Figure 3:
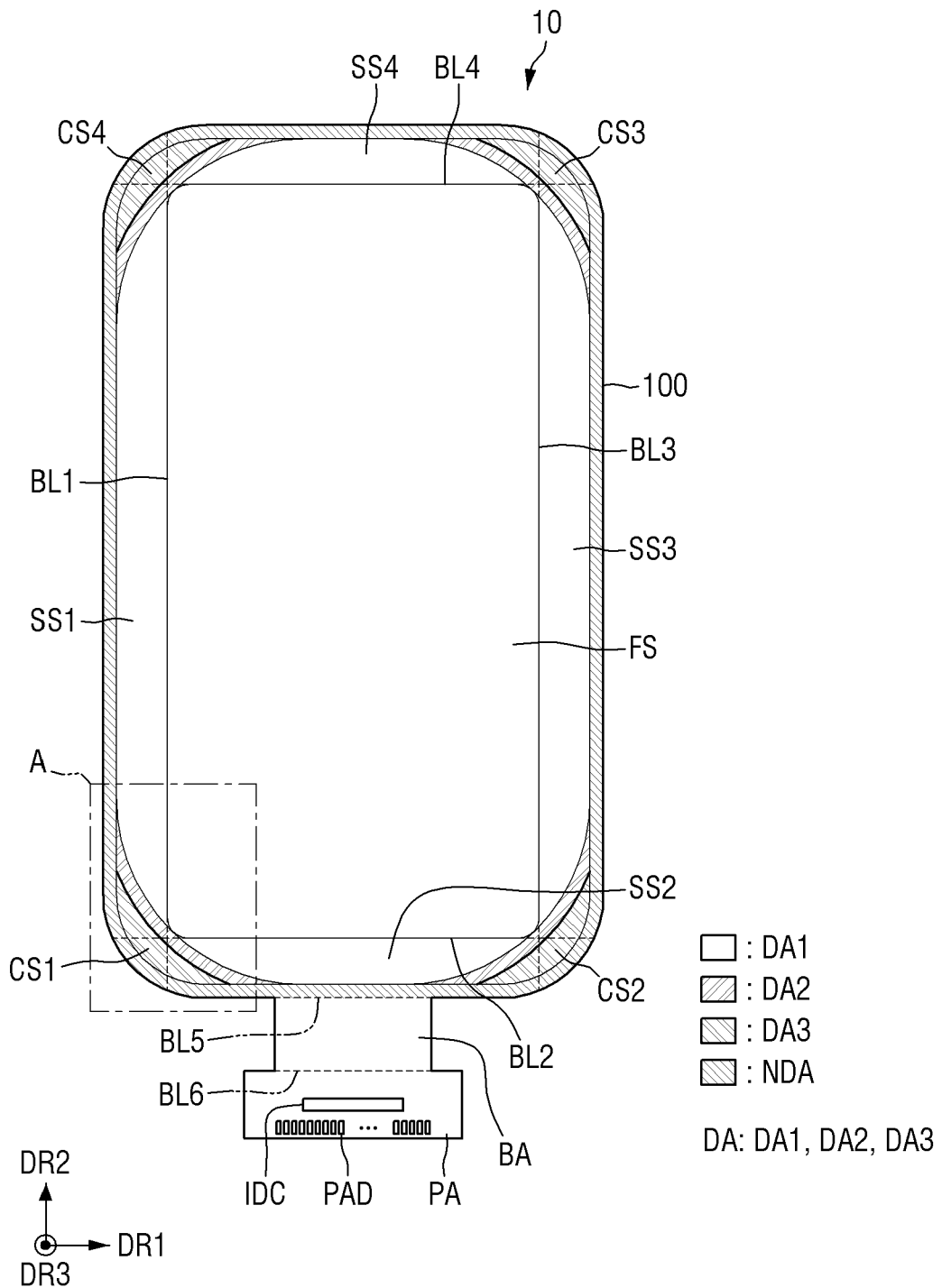
FIG. 3 is an exploded view of the display device of FIG. 1.

Referring to FIGS. 1 and 2, a display device 10 according to an embodiment displays a screen or an image through a display area DA (refer to FIG. 3) and may include various devices including the display area DA (refer to FIG. 3). For example, the display device 10 according to an embodiment may be applied to mobile phones such as smart phones, tablet personal computers (tablet PCs), personal digital assistants (PDAs), portable multimedia players (PMPs), game machines, watch-type electronic appliances, head mount displays, monitors of personal computers, notebook computers, automobile navigators, automobile instrument panels, digital cameras, camcorders, external billboards, sign boards, medical devices, inspection devices, various home appliances such as refrigerators and washing machines, and internet of things (IOTs).

In this specification, in a plan view, short sides of the display device 10 may extend in a direction parallel to the first direction DR1, and long sides of the display device 10 may extend in a direction parallel to the second direction DR2. The first direction DR1 and the second direction DR2 intersect each other so as to be perpendicular to each other. The first direction DR1 may be a horizontal direction of the display device 10 in a plan view, and the second direction DR2 may be a vertical direction of the display device 10 in a plan view. The third direction DR3 is a direction perpendicular to the first direction DR1 and the second direction DR2. For example, the third direction DR3 may be a thickness direction of the display device 10.

The display device 10 according to an embodiment may include a display panel 100. The display panel 100 may be a flexible display panel. For example, the display panel 100 refers to a display panel in which at least a part thereof is bendable, foldable, and/or rollable.

The display panel 100 may include a front portion FS, a first bending portion SS1, a second bending portion SS2, a third bending portion SS3, a fourth bending portion SS4, a first corner portion CS1, a second corner portion CS2, a third corner portion CS3, and a fourth corner portion CS4. The first bending portion SS1, the second bending portion SS2, the third bending portion SS3, the fourth bending portion SS4, the first corner portion CS1, the second corner portion CS2, the third corner portion CS3, and the fourth corner portion CS4 may be divided or defined by bending lines BL1, BL2, BL3, and BL4.

The front portion FS may be surrounded by the first, second, third, and fourth bending lines BL1, BL2, BL3, and BL4. The front portion FS may have a rectangular shape having short sides in the first direction DR1 and long sides in the second direction DR2. When the front portion FS has a rectangular shape, each corner where the long side and short side of the front portion FS meet each other may have a round shape in a plan view, but embodiments are not limited thereto. The front portion FS may have another polygonal, circular or elliptical planar shape. Although it is illustrated in FIGS. 1 and 2 that front portion FS is formed to be flat, embodiments are not limited thereto. For example, at least a part of the front portion FS may have a convex or concave shape in the third direction DR3.

When the front portion FS has a rectangular shape, the front portion FS may include first, second, third, and fourth sides. The first and third sides refer to one side and the other side of the front portion FS in the first direction DR1, and the second and fourth sides refer to one side and the other side of the front portion FS in the second direction DR1.

The first, second, third, and fourth bending portions SS1, SS2, SS3, and SS4 may be disposed at one side and the other side of the front portion FS in the first direction DR1 and one side and the other side of the front portion FS in the second direction DR2. The first, second, third, and fourth bending portions SS1, SS2, SS3, and SS4 may extend from the first, second, third, and fourth sides of the front portion FS and be bent along the bending lines BL1, BL2, BL3, and BL4, respectively. When the first, second, third, and fourth bending portions SS1, SS2, SS3, and SS4 are bent, they may have first, second, third, and fourth curvatures, respectively.

Each of the first, second, third, and fourth corner portions CS1, CS2, CS3, and CS4 may be disposed between the first, second, third, and fourth bending portions SS1, SS2, SS3, and SS4. Each of the first, second, third, and fourth corner portions CS1, CS2, CS3, and CS4 may have a double curvature.

For example, the first corner portion CS1 may be disposed between the first bending portion SS1 and the second bending portion SS2. The first corner portion CS1 may be in contact with the lower side of the first bending portion SS1 and the left side of the second bending portion SS2. The first corner portion CS1 may be a double curvature region that is bent by the first curvature of the first bending portion SS1 and the second curvature of the second bending portion SS2. The descriptions regarding the first corner portion CS1 may be applied to the second, third, and fourth corner units CS2, CS3, and CS4.

Figure 5:
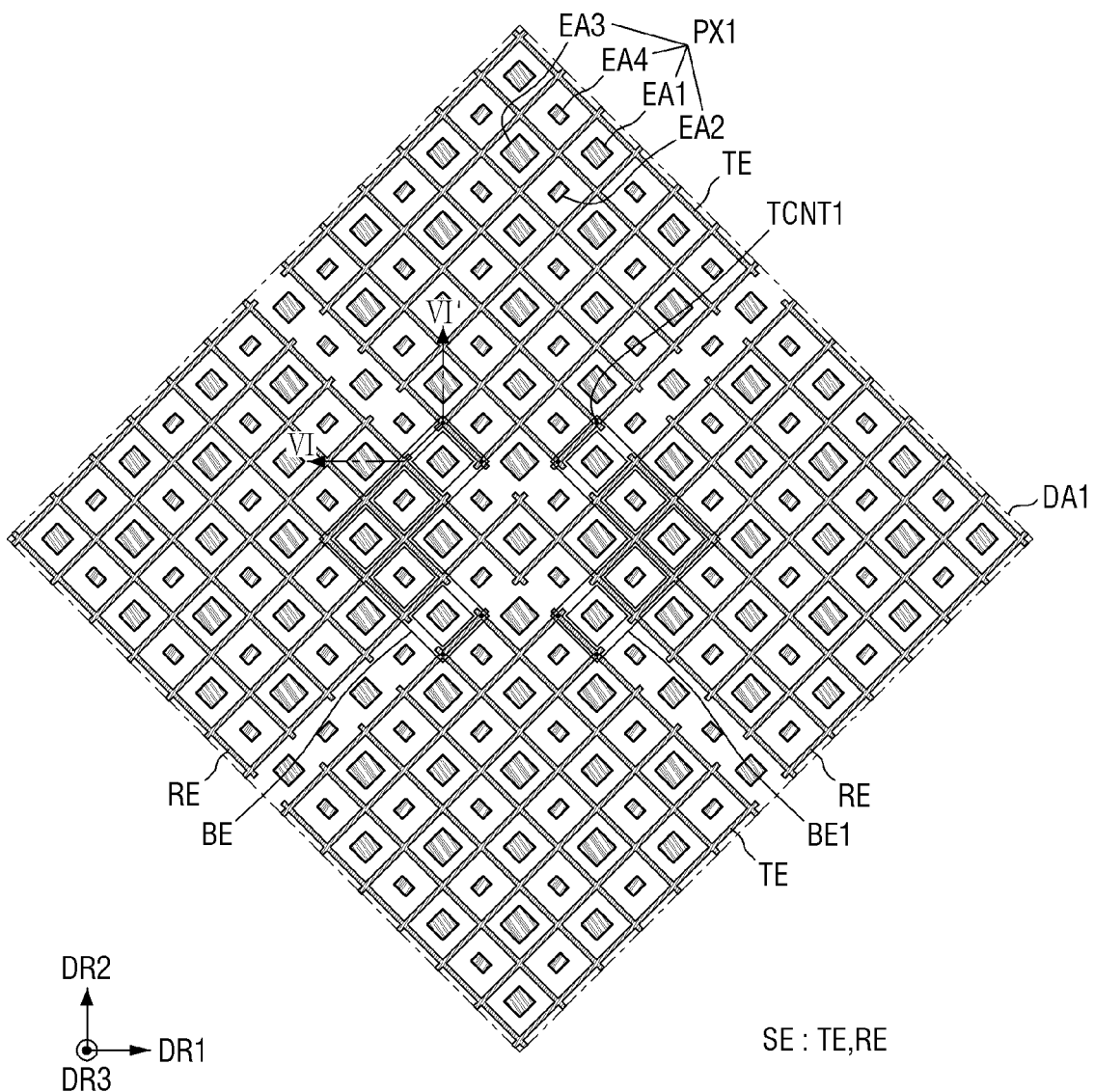
FIG. 5 is a layout view of a first display area of the display device of FIG. 1.

Each of the first corner portion CS1, the second corner portion CS2, the third corner portion CS3, and the fourth corner portion CS4 may be provided with a cutout pattern CP (refer to FIG. 5). Details thereof will be described later.

FIG. 3 is an exploded view of the display device of FIG. 1.

Referring to FIG. 3, the display panel 100 may include a display area DA, a non-display area NDA, a bending unit BA, and a pad unit PA.

The display area DA may display an image. The display area DA may include pixels or light emitting areas. The non-display area NDA may not display an image. The non-display area NDA may not include pixels or light emitting areas. The non-display area NDA may be provided with signal lines for driving pixels or light emitting areas or may be provided with a scan driver. The bezel area of the display device 10 may be configured as the non-display area NDA.

The display area DA may include first, second, and third display areas DA1, DA2, and DA3. Each of the first, second, and third display areas DA (e.g., DA1, DA2, and DA3) may include a plurality of pixels and may display a screen.

The display area DA (e.g., DA1, DA2, and DA3) may be disposed on the front portion FS, the first bending portion SS1, second bending portion SS2, third bending portion SS3, fourth bending portion SS4, first corner portion CS1, second corner portion CS2, third corner CS3, and fourth corner CS4 of the display panel 100. Accordingly, an image may be displayed in not only the front portion FS, the first bending portion SS1, the second bending portion SS2, the third bending portion SS3, the fourth bending portion SS4 of the display panel 100 but also the first corner portion CS1, the second corner portion CS2, the third corner CS3, and the fourth corner CS4 of the display panel 100.

The first display area DA1, which is a main display area of the display panel 100, may be disposed on the front portion FS. However, embodiments are not limited thereto, and the first display area DA1 may be disposed over at least a part of the first bending portion SS1, at least a part of the second bending portion SS2, at least a part of the third bending portion SS3, and at least a part of the fourth bending portion SS4 as well as on the front portion FS.

Each of the second display areas DA2 may be disposed outside any one of corners of the first display area DA1. Each of the second display areas DA2 may be disposed between the first display area DA1 and the third display area DA3. At least a part of each of the second display areas DA2 may be disposed on any one of the corner portions CS1, CS2, CS3, and CS4. Further, at least a part of each of the second display areas DA2 may be disposed on any two of the first, second, third, and fourth bending portions SS1, SS2, SS3, and SS4. Embodiments are not limited thereto, and at least a part of the second display area DA2 may be disposed on the front portion FS.

Although will be described later, the second display area DA2 may be provided with signal lines for driving pixels or light emitting areas and/or a scan driver. Moreover, the second display area DA2 may include a pixel or a light emitting area disposed on the signal lines and/or the scan driver. In this case, the user may not be able to recognize the non-display area between the first display area DA1 and the third display area DA3. In other words, since the second display area DA2 including a pixel or a light emitting area is disposed between the first display area DA1 and the third display area DA3, the user does not recognize a gap between the image displayed by the first display area DA1 and the image displayed by the third display area DA3, and thus the display panel 100 may provide the user with a immersive screen.

Each of the third display areas DA3 may be disposed outside the second display area DA2. At least a part of each of the third display areas DA3 may be disposed on any one of the corner portions CS1, CS2, CS3, and CS4. However, embodiments are not limited thereto, and each of the third display areas DA3 may be disposed on at least any two of the first, second, third, and fourth bending portions SS1, SS2, SS3, and SS4.

As the third display area DA3 is disposed at each corner of the first display area DA1, a screen may be displayed in an area between the bending portions SS1, SS2, SS3, and SS4. When the display device 10 including the third display area DA3 is viewed from the front side, the user may recognize that an image is displayed in the entire area of the display device 10. In other words, the user may recognize that a bezel does not exist substantially, and the display panel 100 may provide the user with a more immersive screen.

The non-display area NDA may be disposed over the first bending portion SS1, the second bending portion SS2, the third bending portion SS3, the fourth bending portion SS4, the first corner portion CS1, the second corner portion CS2, the third corner portion CS3, and the fourth corner portion CS4. The non-display area NDA may be disposed outside the first display area DA1 and the third display area DA3 in the bending portions SS1, SS2, SS3, and SS4. For example, the non-display area NDA may be disposed at the left edge of the first bending portion SS1, the lower edge of the second bending portion SS2, the right edge of the third bending portion SS3, and the upper edge of the fourth bending portion SS4.

The non-display area NDA may be disposed outside the third display area DA3 in the corner portions CS1, CS2, CS3, and CS4. For example, the non-display area NDA may be disposed at an edge of the corner where the upper side and the right side of the first corner portion CS1 meet each other, an edge of the corner where the lower side and the right side of the second corner portion CS2 meet each other, an edge of the corner where the upper side and the right side of the third corner portion CS3 meet each other, and an edge of the corner where the upper side and left side of the fourth corner portion CS4 meet each other.

The bending unit BA may extend from the lower side of the second bending portion SS2. The bending unit BA may be disposed between the second bending portion SS2 and the pad unit PA. The length of the bending unit BA in the first direction DR1 may be shorter than the width of the second bending portion SS2 in the first direction DR1. The bending unit BA may be bent along the fifth bending line BL5 under the second bending portion SS2.

The pad unit PA may extend from the lower side of the bending unit BA. The length of the pad unit PA in the first direction DR1 may be longer than the length of the bending unit BA in the first direction DR1, but embodiments are not limited thereto. For example, the length of the pad unit PA in the first direction DR1 may be substantially equal to the length of the bending unit BA in the first direction DR1. The pad unit PA may be bent along the sixth bending line BL6 under the bending unit BA. The pad unit PA may be disposed on the lower surface of the front portion FS.

An integrated driving circuit IDC and pads PAD may be disposed on the pad unit PA. The integrated driving circuit IDC may be formed as an integrated circuit (IC). The integrated driving circuit IDC may be attached onto the pad unit PA by a chip on glass (COG) method, a chip on plastic (COP) method, or an ultrasonic bonding method. Alternatively, the integrated driving circuit IDC may be disposed on a circuit board disposed on the pads PAD of the pad unit PA.

The integrated driving circuit IDC may be electrically connected to the pads PAD of the pad unit PA. The integrated driving circuit IDC may receive digital video data and timing signals through the pads PAD of the pad unit PA. The integrated driving circuit IDC may convert digital video data into analog data voltages and output the analog data voltages to the data lines of the display areas DA1, DA2, and DA3.

Figure 4:
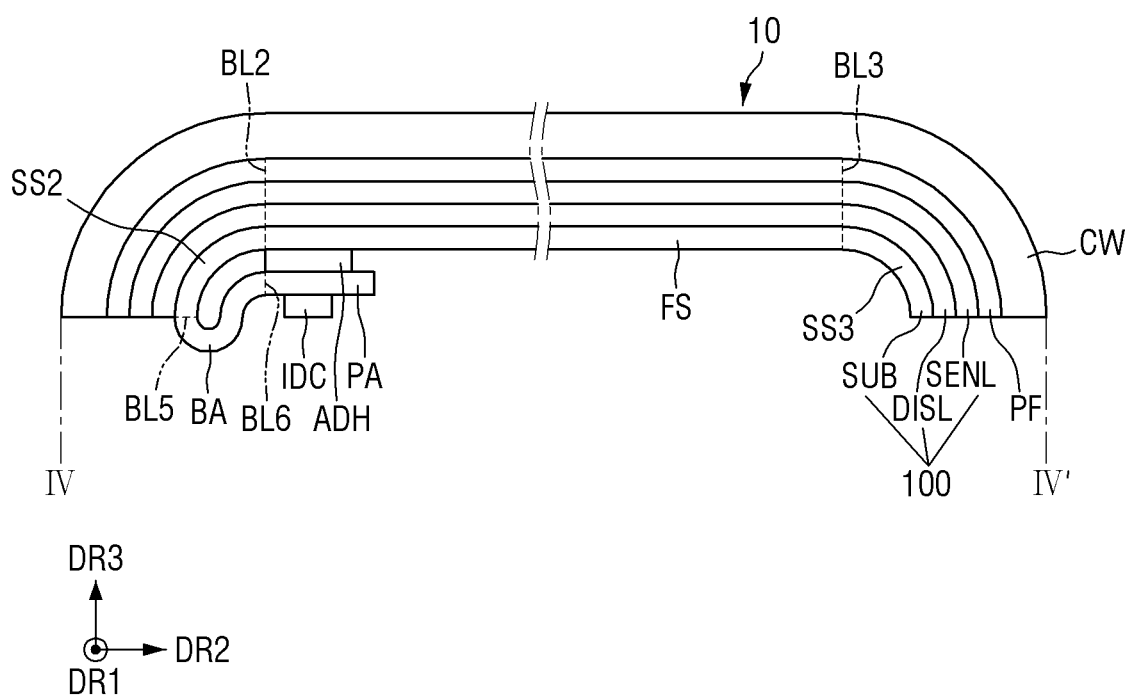
FIG. 4 is a cross-sectional view taken along the line IV-IV' of FIG. 2.

FIG. 4 is a cross-sectional view taken along the line IV-IV' of FIG. 2. FIG. 4 illustrates an example of the display device 10 taken along the line IV-IV' of FIG. 2.

Referring to FIG. 4, the display device 10 may further include a cover window CW and an anti-reflection member PF in addition to the display panel 100. The display panel 100 may include a substrate SUB, a display layer DISL, and a sensor electrode layer SENL. The anti-reflection member PF may be disposed on the display panel 100, and the cover window CW may be disposed on the anti-reflection member PF.

The substrate SUB may support components disposed on the substrate SUB. The substrate SUB may be a flexible substrate capable of bending, folding, rolling, or the like. For example, the substrate SUB may include polyimide (PI). Alternatively, the substrate SUB may include a metal material. Only a part of the substrate SUB may be flexible, or the entire substrate SUB may be flexible.

For example, the substrate SUB may have a plurality of stacked structures. For example, the substrate SUB may include a first substrate and a second substrate, which are sequentially stacked, and may include a sub-buffer layer disposed between the first substrate and the second substrate.

The display layer DISL may be disposed on the substrate SUB. The display layer DISL may be provided thereon with not only a light emitting element, but also a thin film transistor (TFT) for driving the light emitting element, and scan lines, data lines, and power lines, which are electrically connected to the thin film transistor (TFT). The display layer DISL may include an encapsulation layer for encapsulating the light emitting element. Details thereof will be described later.

The sensor electrode layer SENL may be disposed on the display layer DISL. The sensor electrode layer SENL may include sensor electrodes. The sensor electrode layer SENL may sense a touch of a person or an object by using sensor electrodes thereof. The sensor electrode layer SENL may be provided integrally with the display layer DISL, but embodiments are not limited thereto. For example, the sensor electrode layer SENL may be provided in the form of a separate film or panel, and may be disposed on the display layer DISL.

The anti-reflection member PF may be disposed on the sensor electrode layer SENL. The anti-reflection member PF may be attached in the form of a polarizing film. The anti-reflection member PF may polarize passing light. The anti-reflection member PF may serve to reduce the reflection of external light. However, embodiments are not limited thereto, and the anti-reflection member PF may be stacked in the form of an anti-reflection layer inside the display panel 100. In this case, the anti-reflection member PF may include a color filter or the like that selectively transmits light of a specific wavelength.

The cover window CW may be disposed on the anti-reflection member PF. The cover window CW may serve to protect underlying components from external impacts. The cover window CW may be attached onto the anti-reflection member PF by a transparent adhesive member such as an optically clear adhesive (OCA) film or an optically clear resin (OCR) film. The cover window CW may include an inorganic material such as glass, or may include an organic material such as plastic or polymer material.

The bending unit BA may be bent along the fifth bending line BL5 and may be disposed on the lower surface of the second bending portion SS2. The pad unit PA may be bent along the sixth bending line BL6 and may be disposed on the lower surface of the front portion FS. The pad unit PA may be attached to the lower surface of the front portion FS by an adhesive member ADH. The adhesive member ADH may be a pressure sensitive adhesive.

FIG. 5 is a layout view of a first display area of the display device of FIG. 1. FIG. 5 illustrates the plurality of first pixels PX1 of the first display area DA1 and the driving electrodes TE and sensing electrodes RE of the sensor electrode layer SENL (refer to FIG. 4). FIG. 5 illustrates mutual capacitance type touch electrodes including two kinds of sensor electrodes, e.g., driving electrodes TE and sensing electrodes RE. For descriptive convenience, FIG. 5 illustrates only two sensing electrodes RE adjacent to each other in the first direction DR1 and two driving electrodes TE adjacent to each other in the second direction DR2.

Referring to FIG. 5, the driving electrodes TE and the sensing electrodes RE may be electrically separated from each other. Since the driving electrodes TE and the sensing electrodes RE are formed on the same layer, they may be spaced apart from each other. A gap may be formed between the driving electrode TE and the sensing electrode RE.

The sensing electrodes RE may be electrically connected to each other in the first direction DR1. The driving electrodes TE may be electrically connected to each other in the second direction DR2. In order for the sensing electrodes RE and the driving electrodes TE to be electrically separated at their intersections, the driving electrodes TE adjacent to each other in the second direction DR2 may be electrically connected to each other through a connection electrode BE1.

Figure 6:
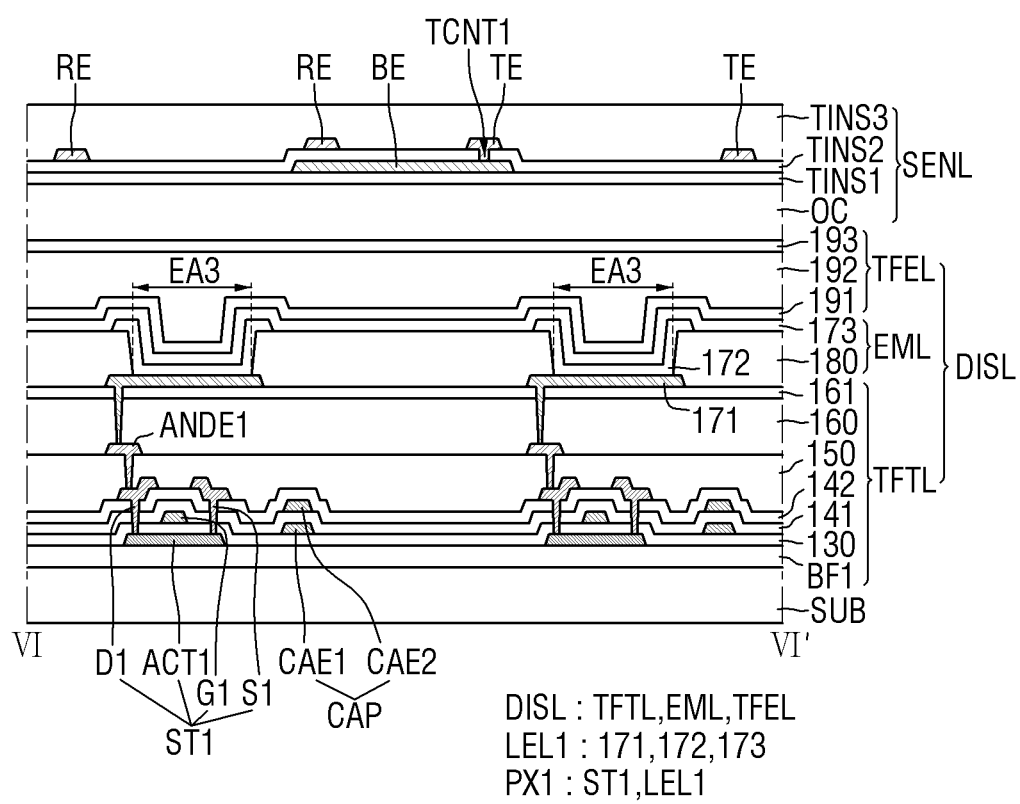
FIG. 6 is a cross-sectional view taken along the line VI-VI' of FIG. 5.

The connection electrode BE1 may be formed on a different layer from the driving electrodes TE and the sensing electrodes RE, and may be connected to the driving electrodes TE through a first touch contact hole TCNT1 (refer to FIG. 6). The connection electrode BE1 may be electrically connected to the driving electrodes TE spaced apart from each other through the first touch contact hole TCNT1, and the driving electrodes TE may be electrically connected through the connection electrode BE1.

The driving electrodes TE and the sensing electrodes RE may have a planar shape of a mesh structure or a mesh structure, respectively, but embodiments are is not limited thereto.

The first display area DA1 may include a plurality of first pixels PX1 for displaying an image. Each of the plurality of first pixels PX1 may include a plurality of light emitting areas EA1, EA2, EA3, and EA4. For example, each of the plurality of first pixels PX1 may include a first light emitting area EA1, a second light emitting area EA2, a third light emitting area EA3, and a fourth light emitting area EA4. The first light emitting area EA1, the second light emitting area EA2, the third light emitting area EA3, and the fourth light emitting area EA4 may emit lights of different colors, but embodiments are not limited thereto.

Since the driving electrodes TE, the sensing electrodes RE, and the connection electrodes BE1 are formed in a planar mesh structure or a planar network structure, the light emitting areas EA1, EA2, EA3, and EA4 may not overlap the driving electrodes TE, the sensing electrodes RE, and the connection electrodes BE1. Accordingly, the lights emitted from the light emitting areas EA1, EA2, EA3, and EA4 may be blocked by the driving electrodes TE, the sensing electrodes RE, and the connection electrodes BE1, thereby preventing or suppressing the reduction of luminance of light.

FIG. 6 is a cross-sectional view taken along the line VI-VI' of FIG. 5.

Referring to FIG. 6, a display layer DISL is disposed on a substrate SUB. The display layer DISL may include a thin film transistor layer TFTL, a light emitting element layer EML, and a thin film encapsulation layer TFEL. A sensor electrode layer SENL including driving electrodes TE, sensing electrodes RE, and connection electrodes BE1 may be disposed on the display layer DISL. Each of the plurality of first pixels PX1 may include a first thin film transistor ST1 and a first light emitting element LEL1.

A thin film transistor layer TFTL including first thin film transistors ST1 may be disposed on the substrate SUB. The thin film transistor layer TFTL may include a first thin film transistor ST1, a first connection electrode ANDE1, a first buffer layer BF1, a gate insulating layer 130, a first interlayer insulating layer 141, and a second interlayer insulating layer 142, a first planarization layer 150, and a second planarization layer 160.

The first buffer layer BF1 may be disposed on the substrate SUB. The first buffer layer BF1 may block impurities that may penetrate from thereunder, improve the adhesion of overlying components, and perform a flattening function. The first buffer layer BF1 may be formed of a silicon nitride layer, a silicon oxy nitride layer, a silicon oxide layer, a titanium oxide layer, or an aluminum oxide layer.

The first thin film transistor ST1 may be disposed on the first buffer layer BF1. The first thin film transistor ST1 may include a first active layer ACT1, a first gate electrode G1, a first source electrode S1, and a first drain electrode D1.

The first active layer ACT1 of the first thin film transistor ST1 may be disposed on the first buffer layer BF1. The first active layer ACT1 may include a silicon semiconductor such as polycrystalline silicon, single crystal silicon, low-temperature polycrystalline silicon, or amorphous silicon. In an area overlapping the first gate electrode G1 in the thickness direction (e.g., in the third direction DR3), the first active layer ACT1 may include a channel region and source/drain regions disposed on one side and the other side of the channel region.

The gate insulating layer 130 may be disposed on the first active layer ACT1 of the first thin film transistor ST1. The gate insulating layer 130 may be formed of an inorganic layer, for example, a silicon nitride layer, a silicon oxy nitride layer, a silicon oxide layer, a titanium oxide layer, or an aluminum oxide layer.

A first gate electrode G1 of the first thin film transistor ST1 and a first capacitor electrode CAE1 may be disposed on the gate insulating layer 130. The first gate electrode G1 of the first thin film transistor ST1 may overlap the first active layer ACT1 in the third direction DR3. The first capacitor electrode CAE1 may overlap a second capacitor electrode CAE2 in the third direction DR3. Each of the first gate electrode G1 and the first capacitor electrode CAE1 may be formed as a single layer or multiple layers including any one of molybdenum (Mo), aluminum (Al), chromium (Cr), gold (Au), titanium (Ti), nickel (Ni), and neodymium (Nd), and copper (Cu), or an alloy thereof.

The first interlayer insulating layer 141 may be disposed on the first gate electrode G1 and the first capacitor electrode CAE1. The first interlayer insulating layer 141 may include an inorganic layer.

The second capacitor electrode CAE2 may be disposed on the first interlayer insulating layer 141. The second capacitor electrode CAE2 may overlap the first capacitor electrode CAE1 in the third direction DR3. A capacitor may be formed by the first capacitor electrode CAE1, the second capacitor electrode CAE2, and the first interlayer insulating layer 141. The second capacitor electrode CAE2 may be formed as a single layer or multiple layers including any one of molybdenum (Mo), aluminum (Al), chromium (Cr), gold (Au), titanium (Ti), nickel (Ni), and neodymium (Nd), and copper (Cu), or an alloy thereof.

The second interlayer insulating layer 142 may be disposed on the second capacitor electrode CAE2. The second interlayer insulating layer 142 may include an inorganic layer.

The first source electrode S1 and the first drain electrode D1 of the first thin film transistor ST1 may be disposed on the second interlayer insulating layer 142. Each of the first source electrode S1 and the first drain electrode D1 may be formed as a single layer or multiple layers including any one of molybdenum (Mo), aluminum (Al), chromium (Cr), gold (Au), titanium (Ti), nickel (Ni), and neodymium (Nd), and copper (Cu), or an alloy thereof.

The first source electrode S1 of the first thin film transistor ST1 may be connected to a conductive region disposed on one side of the channel region of the first active layer ACT1 through a contact hole penetrating the gate insulating layer 130, the first interlayer insulating layer 141, and the second interlayer insulating layer 142. The first drain electrode D1 of the first thin film transistor ST1 may be connected to a conductive region disposed on the other side of the channel region of the first active layer ACT1 through a contact hole penetrating the gate insulating layer 130, the first interlayer insulating layer 141, and the second interlayer insulating layer 142.

The first planarization layer 150 may be disposed on the first source electrode S1 and the first drain electrode D1 to provide a substantially flat surface by covering a step due to the thin film transistors. The first planarization layer 150 may be formed of an organic material such as acrylic resin, epoxy resin, phenolic resin, polyamide resin, polyimide resin, or the like.

The first connection electrode ANDE1 may be disposed on the first planarization layer 150. The first connection electrode ANDE1 may be connected to the first source electrode S1 or the first drain electrode D1 of the first thin film transistor ST1 through a contact hole penetrating the first planarization layer 150. The first connection electrode ANDE1 may be formed as a single layer or multiple layers including any one of molybdenum (Mo), aluminum (Al), chromium (Cr), gold (Au), titanium (Ti), nickel (Ni), and neodymium (Nd), and copper (Cu), or an alloy thereof.

The second planarization layer 160 may be disposed on the first connection electrode ANDE1. The second planarization layer 160 may include an organic material such as acrylic resin, epoxy resin, phenolic resin, polyamide resin, polyimide resin, or the like.

A barrier layer 161 may be disposed on the second planarization layer 160. The barrier layer 161 may include an inorganic layer.

The light emitting element layer EML is disposed on the thin film transistor layer TFTL. The light emitting element layer EML may include a first light emitting element LEL1 and a pixel defining layer 180.

Each of the first light emitting elements LEL1 may include a pixel electrode 171, a light emitting layer 172, and a common electrode 173. Each of the light emitting areas EA1, EA2, EA3, and EA4 refers to an area where a pixel electrode 171, a light emitting layer 172, and a common electrode 173 are sequentially stacked, holes from the pixel electrode 171 are combined with electrons from the common electrode 173 in the light emitting layer 172 to emit light. In this case, the pixel electrode 171 may be an anode electrode, and the common electrode 173 may be a cathode electrode. Each of the first light emitting area EA1, the second light emitting area EA2, and the fourth light emitting area EA4 may be substantially the same as the third light emitting area EA3 illustrated in FIG. 6.

The pixel electrode 171 may be disposed on the barrier layer 161. The pixel electrode 171 may be connected to the first connection electrode ANDE1 through a contact hole penetrating the barrier layer 161 and the second planarization layer 160.

In a top emission structure in which light is emitted toward the common electrode 173 based on the light emitting layer 172, the pixel electrode 171 is formed as a single layer of molybdenum (Mo), titanium (Ti), copper (Cu), or aluminum (Al), or may be formed to have a stacked structure of aluminum and titanium (Ti/Al/Ti), a stacked structure of aluminum and ITO (ITO/Al/ITO), an APC alloy structure, or a stacked structure (ITO/APC/ITO) of APC alloy and ITO. The APC alloy structure may be formed of an alloy of silver (Ag), palladium (Pd), and copper (Cu).

The pixel defining layer 180 serves to define the light emitting areas EA1, EA2, EA3, and EA4 of the display pixels. For example, the pixel defining layer 180 may be formed on the barrier layer 161 to expose a part of the pixel electrode 171. The pixel defining layer 180 may cover an edge of the pixel electrode 171. The pixel defining layer 180 may be disposed in a contact hole penetrating the barrier layer 161 and the second planarization layer 160. Accordingly, the contact hole penetrating the barrier layer 161 and the second planarization layer 160 may be filled by the pixel defining layer 180. The pixel defining layer 180 may be formed of an organic material such as acrylic resin, epoxy resin, phenolic resin, polyamide resin, polyimide resin, or the like.

The light emitting layer 172 is disposed on the pixel electrode 171 exposed by the pixel defining layer 180. The light emitting layer 172 may include an organic material and emit light of a predetermined color. For example, the light emitting layer 172 may include a hole injection/transporting layer, an organic material layer, and an electron injection/transporting layer. The organic material layer may include a host and a dopant. The organic material layer may include a material emitting light of a predetermined color, and may be formed using a phosphorescent material or a fluorescent material.

The common electrode 173 is disposed on the light emitting layer 172. The common electrode 173 may cover the light emitting layer 172. The common electrode 173 may be a common layer commonly formed in display pixels. A capping layer may be formed on the common electrode 173.

In the top emission structure, the common electrode 173 may be formed of a transparent conductive material such as ITO or IZO that can transmit light, or may be formed of a semi-transmissive metal material such as magnesium (Mg), silver (Ag), or an alloy of magnesium (Mg) and silver (Ag). When the common electrode 173 is formed of a semi-transmissive metal material, light emission efficiency may be increased due to micro cavities.

The thin film encapsulation layer TFEL may be formed on the light emitting element layer EML. The thin film encapsulation layer TFEL may include at least one inorganic layer to prevent oxygen or moisture from penetrating into the light emitting element layer EML. Further, the thin film encapsulation layer TFEL may include at least one organic layer to protect the light emitting element layer EML from foreign matter (e.g., particles).

For example, the thin film encapsulation layer TFEL includes a first encapsulation inorganic layer 191 disposed on the common electrode 173, an encapsulation organic layer 192 disposed on the first encapsulation inorganic layer 191, and a second encapsulation inorganic layer 193 disposed on the encapsulation organic layer 192. Each of the first encapsulation inorganic layer 191 and the second encapsulation inorganic layer 193 may be formed as multiple layers in which one or more inorganic layers of a silicon nitride layer, a silicon oxy nitride layer, a silicon oxide layer, a titanium oxide layer, and an aluminum oxide layer are alternately stacked. The organic layer may include at least one of an acrylic resin, an epoxy resin, a phenolic resin, a polyamide resin, and a polyimide resin.

The sensor electrode layer SENL is disposed on the thin film encapsulation layer TFEL. The sensor electrode layer SENL may include an overcoat layer OC, a first touch inorganic layer TINS1, a second touch inorganic layer TIS2, and a touch organic layer TINS3, and may include driving electrodes TE, sensing electrodes RE and connection electrodes BE1.

The overcoat layer OC may be disposed on the thin film encapsulation layer TFEL. The overcoat layer OC may include at least one inorganic layer. For example, the overcoat layer OC may be formed of an organic material such as acrylic resin, epoxy resin, phenolic resin, polyamide resin, polyimide resin, or the like.

The first touch inorganic layer TINS1 may be disposed on the overcoat layer OC. The first touch inorganic layer TINS1 may be formed of a silicon nitride layer, a silicon oxy nitride layer, a silicon oxide layer, a titanium oxide layer, an aluminum oxide layer, or the like.

The connection electrodes BE1 may be disposed on the first touch inorganic layer TINS1. Each of the connection electrodes BE1 may be formed as a single layer of molybdenum (Mo), titanium (Ti), copper (Cu), or aluminum (Al), or may be formed to have a stacked structure (e.g, Ti/Al/Ti) of aluminum and titanium, a stacked structure (e.g., ITO/Al/ITO) of aluminum and ITO, an APC alloy structure, or a stacked structure (e.g., ITO/APC/ITO) of APC alloy and ITO. For example, the APC alloy structure may be formed of an alloy of silver (Ag), palladium (Pd), and copper (Cu).

The second touch inorganic layer TINS2 may be disposed on the connection electrodes BE1. The second touch inorganic layer TINS2 may be formed of a silicon nitride layer, a silicon oxy nitride layer, a silicon oxide layer, a titanium oxide layer, an aluminum oxide layer, or the like.

The driving electrodes TE and the sensing electrodes RE may be disposed on the second touch inorganic layer TINS2. Each of the driving electrodes TE and the sensing electrodes RE may be formed as a single layer of molybdenum (Mo), titanium (Ti), copper (Cu), or aluminum (Al), or may be formed to have a stacked structure (e.g., Ti/Al/Ti) of aluminum and titanium, a stacked structure (e.g., ITO/Al/ITO) of aluminum and ITO, an APC alloy structure, or a stacked structure (e.g., ITO/APC/ITO) of APC alloy and ITO. For example, the APC alloy structure may be formed of an alloy of silver (Ag), palladium (Pd), and copper (Cu).

The touch organic layer TINS3 may be disposed on the driving electrodes TE and the sensing electrodes RE. The touch organic layer TINS3 may include an acrylic resin, an epoxy resin, a phenolic resin, a polyamide resin, a polyimide resin, or the like.

Figure 7:
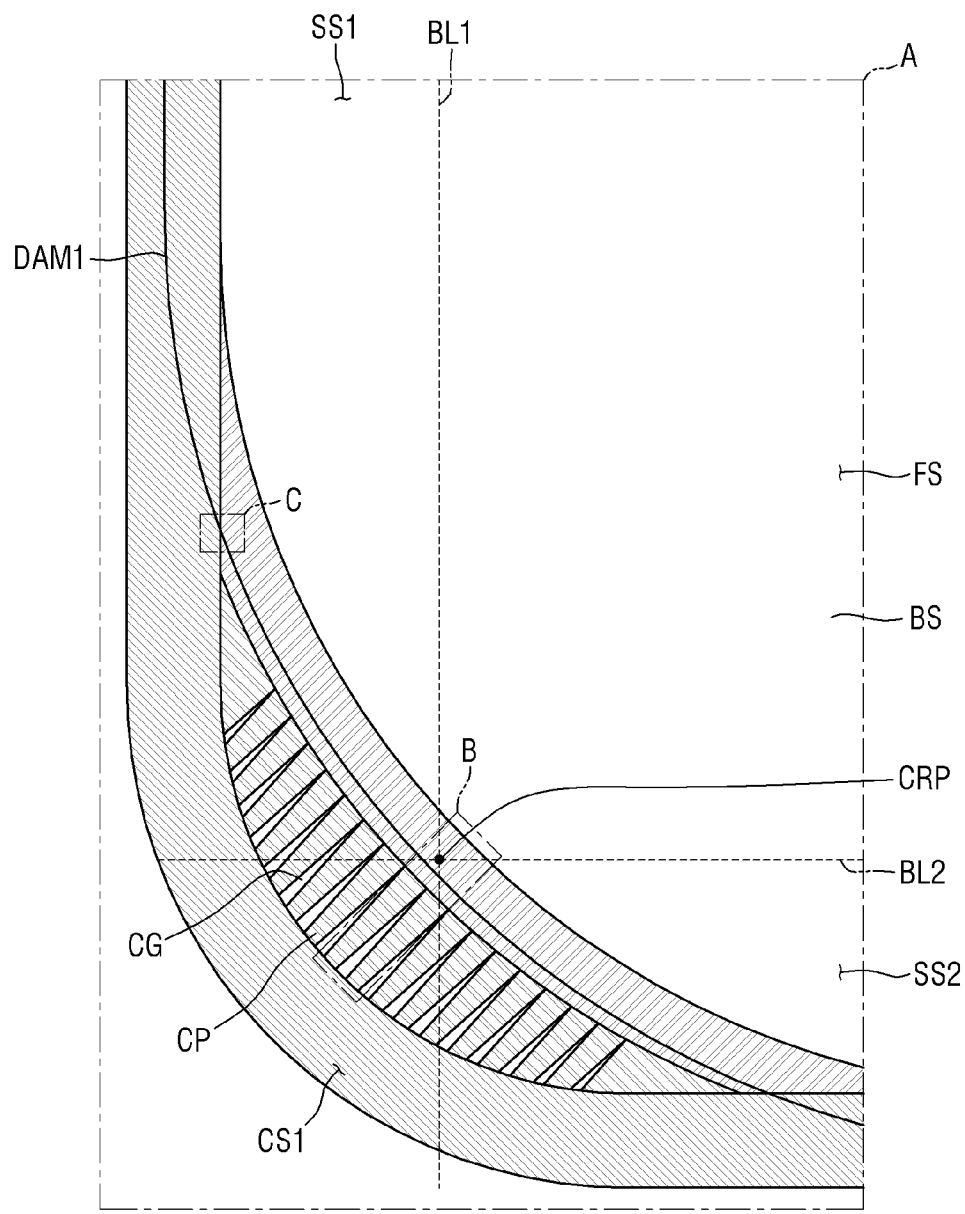
FIG. 7 is an enlarged view of the area A of FIG. 3.

FIG. 7 is an enlarged view of the area A of FIG. 3. FIG. 7 is a layout view specifically illustrating the display areas DA (e.g., DA1, DA2, and DA3) and the non-display area NDA arranged in the first corner portion CS1 of the display panel 100 according to an embodiment.

Referring to FIG. 7, an intersection point CRP of the first bending line BL1 and the second bending line BL2 may be disposed in the second display area DA2. In this case, the first display area DA1 may be disposed on the front portion FS, the first bending portion SS1, the second bending portion SS2, and the first corner portion CS1. The second display area DA2 may be disposed on the first bending portion SS1, the second bending portion SS2, and the first corner portion CS1. For example, the second display area DA2 may be disposed on the front portion FS, the first bending portion SS1, the second bending portion SS2, and the first corner portion CS1. The third display area DA3 may be disposed in the first bending portion SS1, the second bending portion SS2, and the first corner portion CS1. The non-display area NDA may be disposed on the first bending portion SS1, the second bending portion SS2, and the first corner portion CS1.

For example, the position of the intersection point CRP of the first bending line BL1 and the second bending line BL2 is not limited thereto, and the intersection point CRP thereof may be disposed in the first display area DA1 or the third display area DA3.

The substrate SUB may include a base portion BS and a cutout pattern CP. The base portion BS of the substrate SUB may be disposed over the front portion FS and the bending portions SS1, SS2, SS3, and SS4. The base portion BS may be disposed over the first display area DA1 and the second display area DA2. A first pixel PX1 and a second pixel PX2 may be disposed on the base portion BS, and a first dam DAM1 may be disposed thereon. The first dam DAM1 may be disposed along the edge of the base portion BS.

The cutout pattern CP may protrude from the base portion BS. One end of the cut pattern CP may be connected to the base portion BS. Except for a portion in which the cut pattern CP is connected to the base portion BS, the remaining area may be exposed. In other word, except for a portion in which the cut pattern CP is connected to the base portion BS, the remaining area may be separated from the base portion BS, and may be at least partially separated from the adjacent cutout pattern CP. The cutout pattern CP may be disposed in the third display area DA3. A plurality of cutout patterns CP may be provided.

The plurality of cutout patterns CP may be disposed in at least one of the corner portions CS1, CS2, CS3, and CS4. However, embodiments are not limited thereto, and some of the plurality of cutout patterns CP may be disposed in any one of the bending portions SS1, SS2, SS3, and SS4. A second dam DAM2 (refer to FIG. 8) is disposed on each cut pattern CP, and may be disposed along an edge of each cutout pattern CP. The planar shape of the second dam DAM2 (refer to FIG. 8) may correspond to the planar shape of the cutout pattern CP, but embodiments are not limited thereto. For example, the planar shape of the second dam DAM2 may be smaller than the planar shape of the cutout pattern CP.

The end of the base portion BS, from which the plurality of cutout patterns CP protrudes, may include a curve portion, but embodiments are not limited thereto. Accordingly, directions, in which the plurality of cutout patterns CP protrude, may be different from each other. The length of each cutout pattern CP in the direction protruding from the base portion CS may be greater than the width of each cutout pattern CP in a direction perpendicular to the direction protruding from the base portion CS.

Each of the cutout patterns CP protrudes from the base portion BS and may be connected to the base portion BS. In a plan view, the adjacent cutout patterns CP may be spaced apart from each other in at least some areas.

The width of each cutout pattern CP may decrease as moving toward the non-display area NDA. In this case, each of the cutout patterns CP may have a trapezoidal shape in a plan view, but embodiments are not limited thereto. When each of the cutout patterns CP has a trapezoidal shape, one side of the trapezoidal shape may be connected to the base portion BS, and other three sides of the trapezoidal shape may be separated from other components without being connected to the other components.

The plurality of cutout patterns CP may face each other, e.g., in the first direction DR1 or in the second direction DR2. In other words, the plurality of cutout patterns CP may be spaced apart from each other by a cutout portion CG interposed therebetween, and the side surfaces of each cut pattern CP may face each other. In a plan view, the interval between the cutout patterns CP adjacent to each other may increase as moving toward the non-display area NDA.

When the cutout patterns CP are bent, the interval between the cutout patterns CP adjacent to each other may decrease, or the cutout patterns CP adjacent to each other may be in direct contact with each other. When the cutout patterns CP adjacent to each other may be in direct contact with each other, a physical interface (e.g., a boundary portion) may be located between the cutout patterns CP adjacent to each other. However, embodiments are not limited thereto. For example, when the cutting patterns CP are bent, the cutting patterns CP adjacent to each other may overlap each other, e.g., in the third direction DR3. Moreover, when the cutting patterns CP are bent, the interval between the third pixels PX3 disposed on each cutout pattern CP may decrease.

The cutout pattern CP located at the outermost of the plurality of cutout patterns CP may be in direct contact with the base portion BS disposed on the adjacent bent portions SS1, SS2, SS3, and SS4 while bending the cutting patterns CP. In this case, a physical interface (e.g., a boundary portion) may be located between the cutout pattern CP and the base portion BS that is adjacent to the cutout pattern CP and disposed on the adjacent bent portions SS1, SS2, SS3, and SS4.

The cutout patterns CP adjacent to each other may be spaced apart from each other in at least some areas by the cutout portion CG. A space may be provided between the cutout patterns CP adjacent to each other by the cutout portion CG. Accordingly, even when the first corner portion CS1 has a double curvature, the first corner portion CS1 may be stretched and contracted, so that strain applied to the first corner portion CS1 may be reduced by the cutout portions CG. The cutout patterns CP may be formed by cutting the substrate (SUB of FIG. 4) of the display panel 100 with a laser, but embodiments are not limited thereto.

The curvature of the outside of the third display area may be greater than the curvature of the inside thereof. For example, the third display area DA3 may have a planar crescent shape. For this reason, the areas of the cutout patterns CP in the first corner portion CS1 may be different from each other. Further, the protruding length of each of the cutout patterns CP in the first corner portion CS1 may be substantially the same as the minimum length between the cutout pattern CP and the non-display area NDA at the position where the cutout pattern CP contacts the second display area DA2.

The display panel 100 may further include a first dam DAM1. The first dam DAM1 may be disposed to surround the first display area DA1. The first dam DAM1 may be disposed across the second display area DA2 and the non-display area NDA. The first dam DAM1 may be disposed over the first corner portion CS1, the first bending portion SS1, and the second bending portion SS2. For example, the first dam DAM1 may also be disposed over the second, third, and fourth corner portions CS2, CS3, CS4 and the third and fourth bending portions SS3 and SS4. Details of the first dam DAM1 will be described later.

Figure 8:
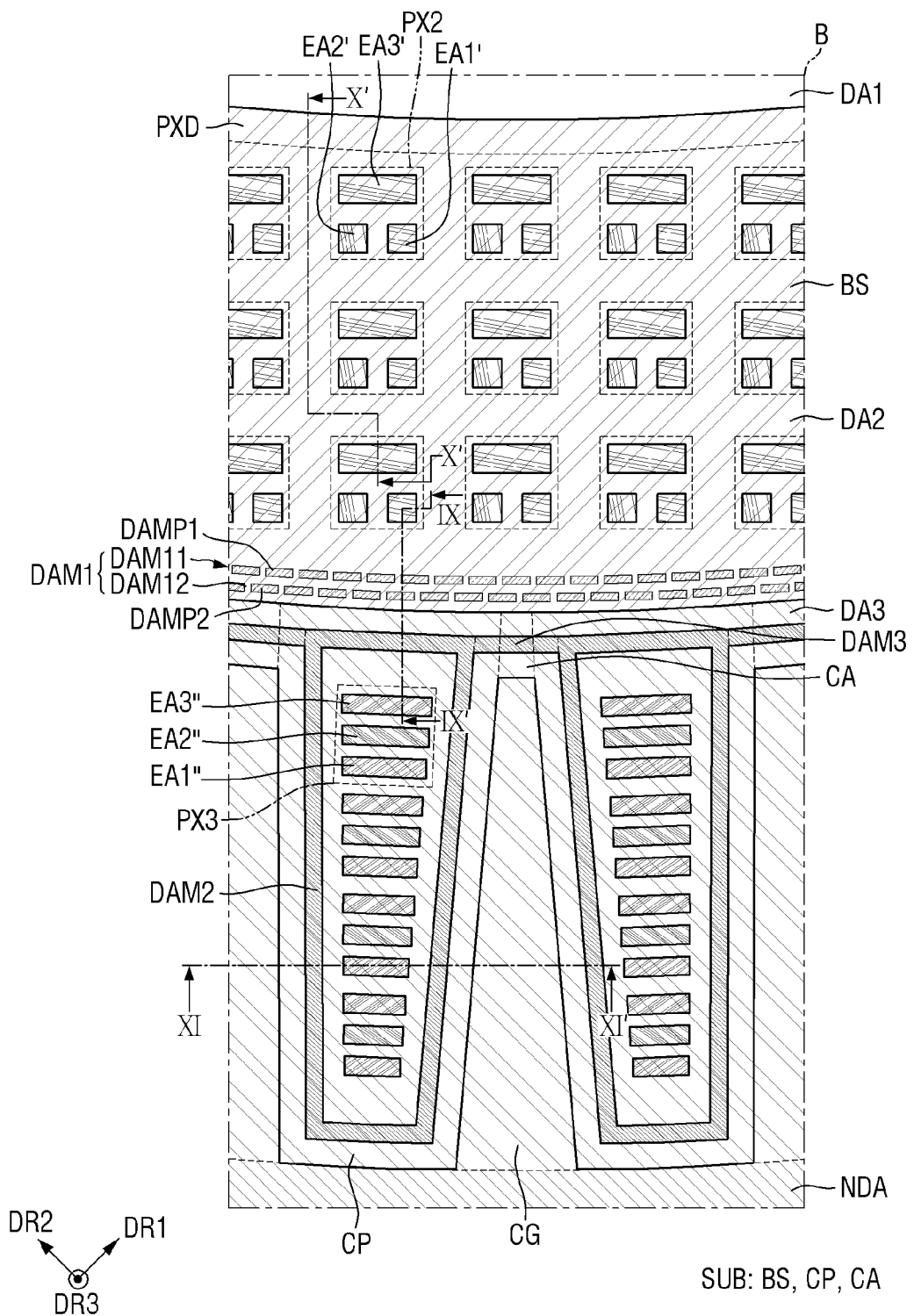
FIG. 8 is an enlarged view of the area B of FIG. 7.
Figure 9:
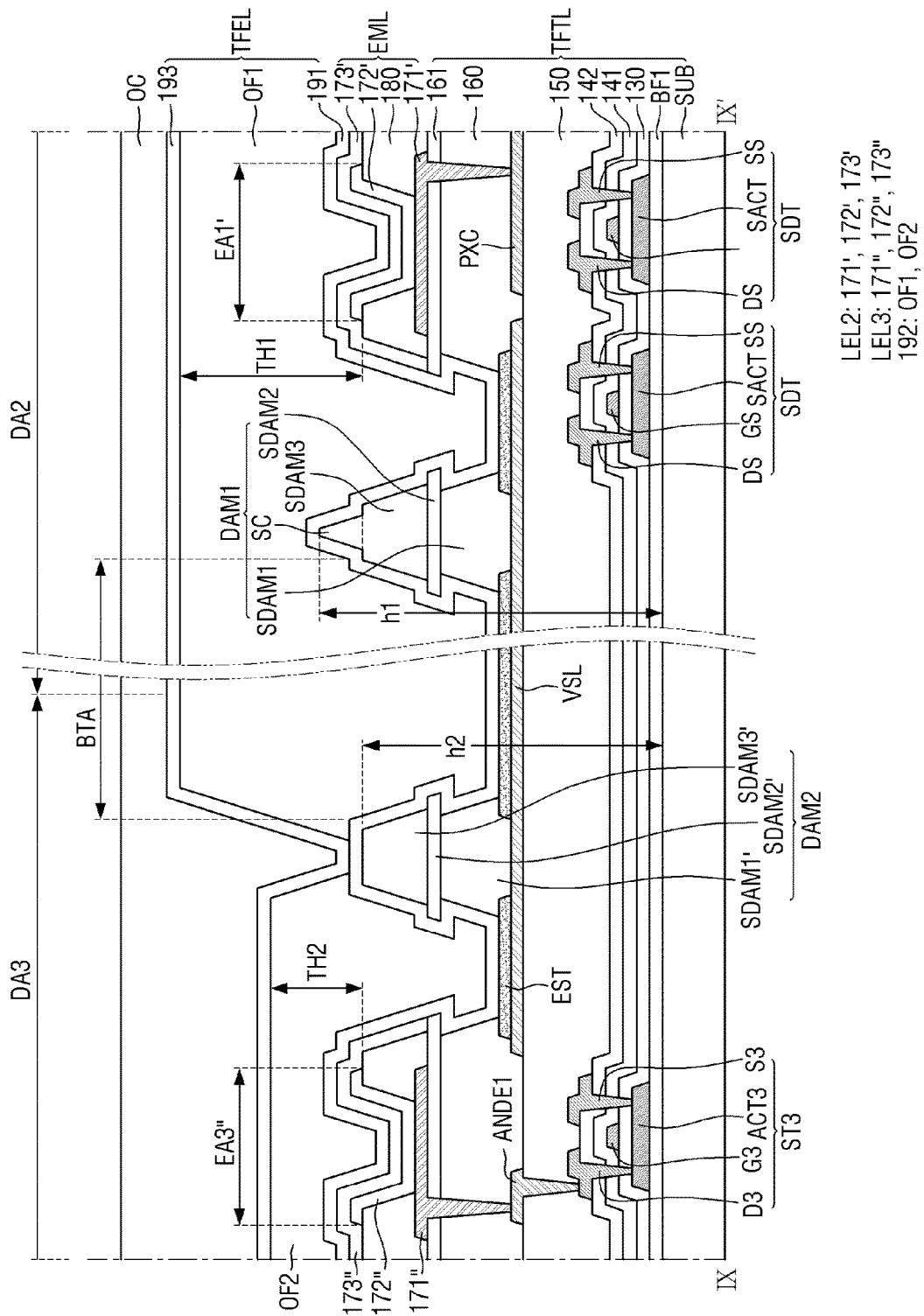
FIG. 9 is a cross-sectional view taken along the line IX-IX' of FIG. 8.
Figure 10:
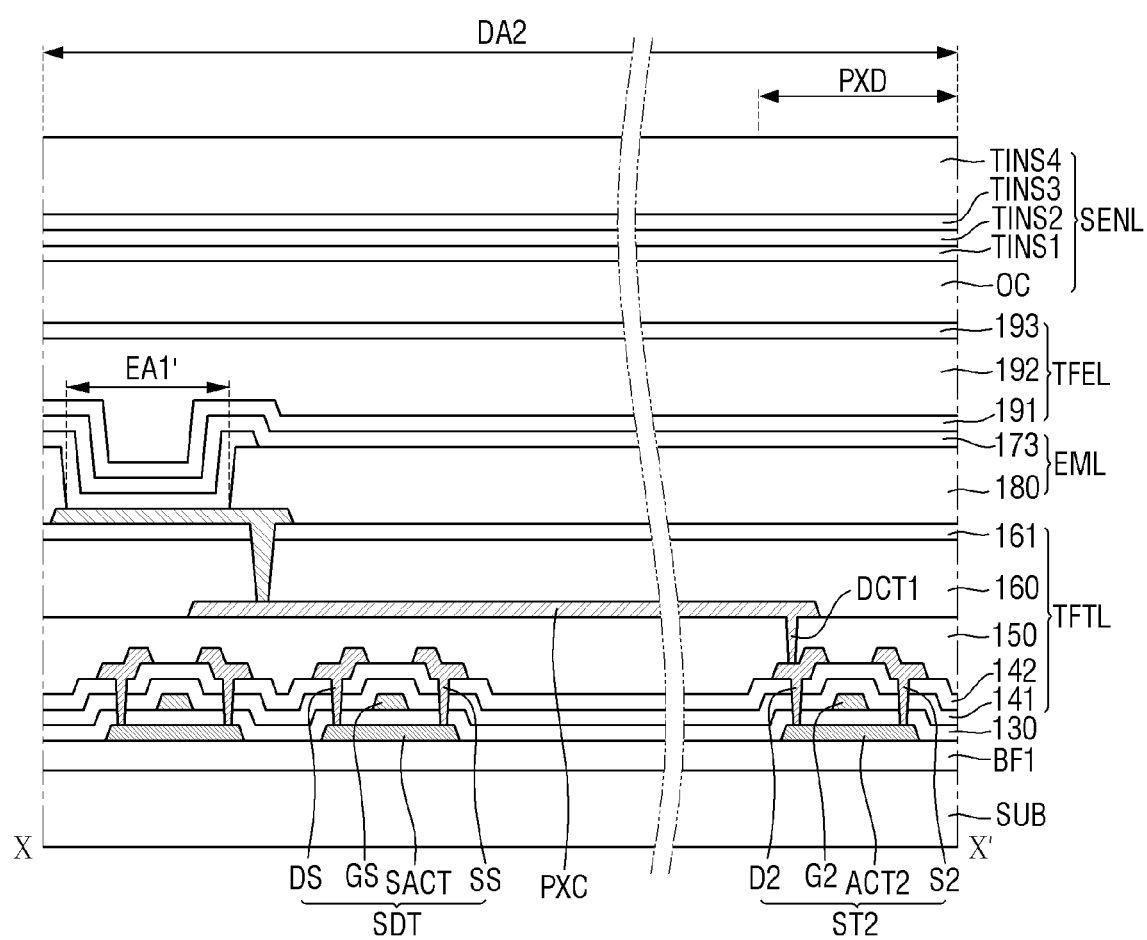
FIG. 10 is a cross-sectional view taken along the line X-X' of FIG. 8.
Figure 11:
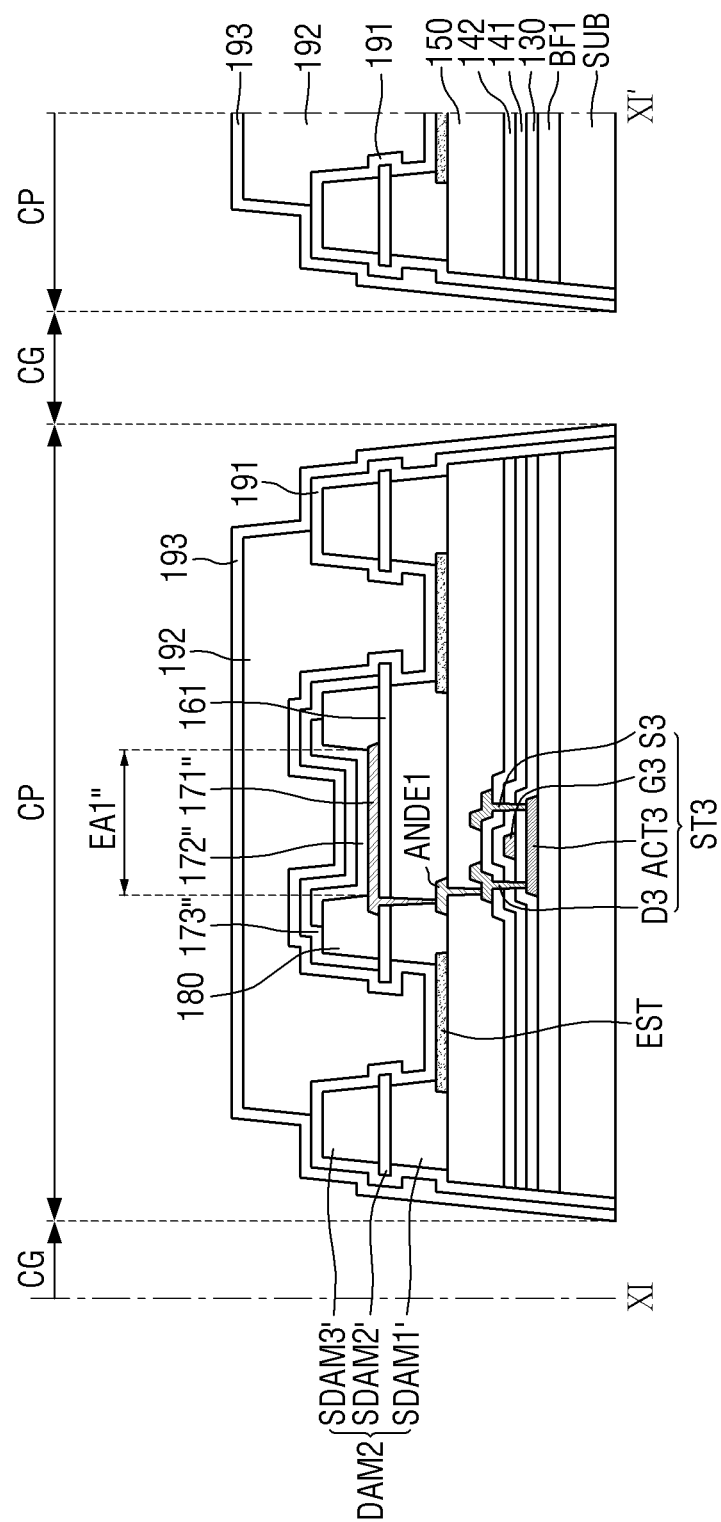
FIG. 11 is a cross-sectional view taken along the line XI-XI' of FIG. 8.

FIG. 8 is an enlarged view of the area B of FIG. 7. FIG. 9 is a cross-sectional view taken along the line IX-IX' of FIG. 8. FIG. 10 is a cross-sectional view taken along the line X-X' of FIG. 8. FIG. 11 is a cross-sectional view taken along the line XI-XI' of FIG. 8. FIG. 8 specifically illustrates the second and third display areas DA2 and DA3 disposed in the first corner portion CS1 of the display panel 100 according to an embodiment.

Further referring to FIGS. 8, 9, 10, and 11, the second display area DA2 may include a plurality of second pixels PX2, and the third display area DA3 may include a plurality of third pixels PX3. Each of the plurality of second pixels PX2 may include a plurality of light emitting areas EA1', EA2', and EA3', and each of the plurality of third pixels PX3 may include a plurality of light emitting areas EA1", EA2", and EA3".

The second display area DA2 may include a second thin film transistor ST2 and a scan driving transistor SDT. The second thin film transistor ST2 may drive the second pixel PX2, and the scan driving transistor SDT may drive the first pixel PX1.

A driving voltage line VSL may be further disposed in the second display area DA2. The driving voltage line VSL may apply a driving voltage to the first pixel PX1 of the first display area DA1. However, embodiments are not limited thereto, and the driving voltage line VSL may apply a driving voltage to at least one of the second pixel PX2 of the second display area DA2 and the third pixel PX3 of the third display area DA3.

The driving voltage line VSL may be disposed not only in the second display area DA2 but also in the non-display area NDA. In other words, the driving voltage line VSL may be disposed across the second display area DA2 and the non-display area NDA. The driving voltage line VSL may also be disposed in the third display area DA3. In this case, the driving voltage wiring VSL may overlap the first and second dams DAM1 and DAM2 in the thickness direction (e.g., in the third direction DR3).

The driving voltage line VSL may be disposed on the first planarization layer 150, and may be provided thereon with an etch prevention pattern EST and the first and second dams DAM1 and DAM2. The driving voltage line VSL and the first connection electrode ANDE1 may be formed on the same layer (e.g., the first planarization layer 150), but embodiments are not limited thereto.

The second display area DA2 may further include a pixel driver PXD. The pixel driver PXD may be disposed in an area adjacent to the first display area DA1 in the second display area DA2, but embodiments are not limited thereto. Second thin film transistors ST2 may be disposed in the pixel driver PXD. However, embodiments are not limited thereto, and scan driving transistors SDT of the scan driver may be further disposed in the pixel driver PXD.

The scan driving transistor SDT may be disposed in the second display area DA2 and may be disposed under the second pixel PX2, but embodiments are not limited thereto.

The scan driving transistor SDT may include a scan active layer SACT, a scan gate electrode SG, a scan source electrode SS, and a scan drain electrode SD. Since the scan active layer SACT, the scan gate electrode SG, the scan source electrode SS, and the scan drain electrode SD of the scan driving transistor SDT are substantially the same as the first active layer ACT1, the first gate electrode G1, the first source electrode S1, and the first drain electrode D1 of the first thin film transistor ST1, a description of the scan driving transistor SDT will be omitted for descriptive convenience.

The second thin film transistor ST2 may include a second active layer ACT2, a second gate electrode G2, a second source electrode S2, and a second drain electrode D2. Since the second active layer ACT2, the second gate electrode G2, the second source electrode S2, and the second drain electrode D2 of the second thin film transistor ST2 are substantially the same as the first active layer ACT1, the first gate electrode G1, the first source electrode S1, and the first drain electrode D1 of the first thin film transistor ST1 of FIG. 6, a description of the second thin film transistor ST2 will be omitted for descriptive convenience.

The display panel 100 may further include a pixel connection line PXC. The pixel connection line PXC may extend in one direction. In other words, the pixel connection line PXC may extend from the outside of the pixel driver PXD to the inside of the pixel driver PXD. The pixel connection line PXC1 may overlap at least one scan driving transistor SDT in the third direction DR3.

The pixel connection line PXC may be connected to the second drain electrode D2 of the second thin film transistor ST2 through a first driving contact hole DCT1. The first driving contact hole DCT1 may be a hole penetrating the first planarization layer 150 to expose the second drain electrode D2 of the second thin film transistor ST2.

The pixel electrode 171' of the first light emitting area EA1' may be connected to the pixel connection line PXC through a first pixel contact hole PCT1. Although it is shown in the drawings that the pixel electrode 171' of the first light emitting area EA1' is electrically connected to the pixel connection line PXC in a cross-sectional view, the description thereof may also be applied to the pixel electrode 171' of the second light emitting area EAT and the pixel electrode 171' of the third light emitting area EA3'.

The pixel connection line PXC and the first connection electrode ANDE1 may be disposed on the same layer (e.g., the first planarization layer 150), and may be formed of the same material as the first connection electrode ANDE1. For example, the pixel connection line PXC may be disposed on the first planarization layer 150. The second planarization layer 160 may be disposed on the pixel connection line PXC.

The pixel electrode 171' of the second light emitting element LEL2 may be connected to the pixel connection line PXC through the first pixel contact hole PCT1. The first pixel contact hole PCT1 may be a hole penetrating the second planarization layer 160 to expose the pixel connection line PXC.

The third display area DA3 may include third thin film transistors ST3. The third thin film transistor ST3 may include a third active layer ACT3, a third gate electrode G3, a third source electrode S3, and a third drain electrode D3. Since the third active layer ACT3, the third gate electrode G3, the third source electrode S3, and the third drain electrode D3 of the third thin film transistor ST3 are substantially the same as the first active layer ACT1, the first gate electrode G1, the first source electrode S1, and the first drain electrode D1 of the first thin film transistor ST1 of FIG. 6, a description of the third thin film transistor ST3 will be omitted for descriptive convenience.

Since the third light emitting elements LEL3 of the light emitting element layer EML are substantially the same as the first light emitting elements LEL1 of the light emitting element layer EML of FIG. 6, a description of the third light emitting elements LEL3 of the light emitting element layer EML will be omitted for descriptive convenience.

The first encapsulation inorganic layer 191 and the second encapsulation inorganic layer 193 may be disposed on the cut surface or the side surface of the cutout pattern CP. For example, the first encapsulation inorganic layer 191 and the second encapsulation inorganic layer 193 may be disposed on the cut surfaces and side surfaces of the substrate SUB, the first buffer layer BF1, the gate insulating layer 130, the first interlayer insulating layer 141, the second interlayer insulating layer 142, the first planarization layer 150 of the cutout pattern CP. Accordingly, it is possible to prevent the light emitting layer 172" from being damaged by introducing moisture or oxygen through the cut surface or the side surface of the cutout pattern CP.

The first dam DAM1 may be disposed outside the second pixel PX2 in the second display area DA2. In other words, the first dam DAM1 may be disposed in the second display area DA2 and may be disposed between the second pixel PX2 and the third display area DA3 in a plan view. Alternatively, the first dam DAM1 may be disposed in the second display area DA2 and may be disposed between the second pixel PX2 and the second dam DAM2 in a plan view.

The first dam DAM1 may have different patterns from each other in the non-display area NDA and the second display area DA2. Hereinafter, details thereof will be described in detail further with reference to FIG. 12.

Figure 12:
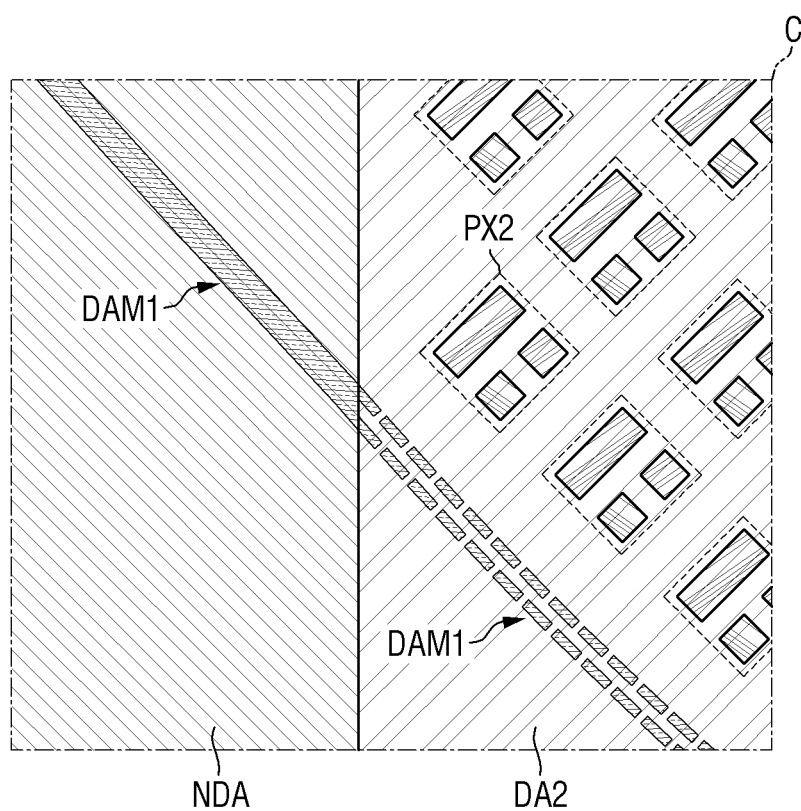
FIG. 12 is an enlarged view of the area C of FIG. 7.

FIG. 12 is an enlarged view of the area C of FIG. 7. FIG. 12 illustrates a planar shape of the first dam DAM1 disposed in the second display area DA2 and the non-display area NDA.

Further, referring to FIG. 12, the first dam DAM1 disposed in the non-display area NDA may have a linear shape extending along the edge of the first display area DA1. The first dam DAM1 may be disposed in the non-display area NDA located at one side and the other side of the first display area DA1 in the first direction DR1 and at one side and the other side of the first display area DA1 in the second direction DR2, and each portion of the first dam DAM1 disposed in the non-display area NDA may be integrally formed. The first dam DAM1 disposed in the second display area DA2 may not be integrally formed, and may have a shape in which a plurality of first unit patterns DAMP1 and a plurality of second unit patterns DAMP2 are repeatedly arranged.

Specifically, in the second display area DA2, the first dam DAM1 may include a first dam pattern DAM11 and a second dam pattern DAM12. The first dam pattern DAM11 and the second dam pattern DAM12 may be disposed to surround the first display area DA1. The second dam pattern DAM12 may be disposed outside the first dam pattern DAM11. In other words, the second dam pattern DAM12 may be disposed closer to the third display area DA3 than the first dam pattern DAM11, and the second dam pattern DAM12 may be disposed between the first dam pattern DAM11 and the second dam DAM2.

The first dam pattern DAM11 may include a plurality of first unit patterns DAMP1 spaced apart from each other, and the second dam pattern DAM12 may include a plurality of second unit patterns DAMP2 spaced apart from each other. The first unit pattern DAMP1 and the second unit pattern DAMP2 may be spaced apart from each other. The first unit patterns DAMP1 of the first dam pattern DAM11 and the second unit patterns DAMP2 of the second dam pattern DAM12 may be repeatedly arranged to surround the first display area DA1, respectively.

Each of the first unit patterns DAMP1 and each of the second unit patterns DAMP2 may be formed in an island shape. The first unit pattern DAMP1 and the second unit pattern DAMP2 may have the same planar shape, but embodiments are not limited thereto. Each of the first unit pattern DAMP1 and the second unit pattern DAMP2 may have a rectangular shape, but embodiments are not limited thereto.

A direction, in which the first unit patterns DAMP1 are repeatedly arranged in the first dam pattern DAM11, may be substantially the same as a direction in which the second unit patterns DAMP2 is repeatedly arranged in the second dam pattern DAM12. The first unit patterns DAMP1 and the second unit patterns DAMP2 may be alternately arranged. In other words, the virtual straight line passing between two adjacent first unit patterns DAMP1 may pass through the first unit pattern DAMP1 adjacent to the second unit pattern DAMP2. Further, the virtual straight line passing between two adjacent second unit patterns DAMP2 may pass through the first unit pattern DAMP1 adjacent to the second unit pattern DAMP2.

Accordingly, when the encapsulation organic layer 192 or the first organic layer OF1 is disposed on the first dam DAM1, the flow of the encapsulation organic layer 192 or the first organic layer OF1 flowing from the first display area DA1 and the second display area DA2 to the third display area DA3 may be controlled by a capillary phenomenon between the unit patterns DAMP1 and DAMP2.

In other words, in the case of forming the encapsulation organic layer 192 or the first organic layer OF1, a capillary phenomenon may occur in the space between the unit patterns DAMP1 and DAMP2, and the encapsulation organic layer 192 or the first organic layer OF1 may flow so as to preferentially fill between the unit patterns DAMP1 and DAMP2 rather than overflowing the unit patterns DAMP1 and DAMP2 of the first dam DAM1. Accordingly, the flow of the encapsulation organic layer 192 or the first organic layer OF1 may be controlled, and the encapsulation organic layer 192 or the first organic layer OF1 may substantially uniformly proceed toward the third display area DA3. Moreover, the encapsulation organic layer 192 or the first organic layer OF1 may be disposed to have a substantially uniform thickness at one side of the second dam DAM2, and visual recognition of the encapsulation organic layer 192 or the first organic layer OF1 may be suppressed or prevented.

The second dam DAM2 may be disposed in the third display area DA3. The second dam DAM2 may be provided for each cutout pattern CP. The second dam DAM2 may be disposed to surround the plurality of third pixels PX2 disposed in each cutout pattern CP. The second Dam2 may be disposed along the edge of the cutout pattern CP.

The second dams DAM2 of the respective cutout patterns CP may be connected to each other by a connection dam DAM3. In this case, one side of one cutout patterns CP and one side of another cutout pattern CP may be connected to each other. For example, the substrate SUB may further include a connection area CA, the connection area CA may be disposed in an area close to the second display area DA2 in each cutout portion CG, and adjacent cutout patterns CP may be connected in some areas by the connection area CA. In this case, at least a part of the connection dam DAM3 may be disposed in the connection area CA.

However, embodiments are not limited thereto, and the connection area CA may be omitted. In this case, the connection dam Dam3 may connect the second dams DAM2 of the adjacent cutout patterns CP through the second display area DA2 of the base portion BS.

The second dams DAM2 adjacent to each other may be interconnected by the connection dam DAM3, and the first pixel PX1 of the first display area DA1 and the second pixel PX2 of the second display area DA2 may be surrounded by the second dam DAM2 and the connection dam DAM3. Therefore, even when the first unit pattern DAMP1 and second unit pattern DAMP2 of the first dam DAM1 have an island shape, it is possible to prevent the encapsulation organic layer 192 from overflowing into the cutout portion CG. In other words, the second dam DAM2 and the connecting dam DAM3 may prevent the encapsulation organic layer 192 disposed in the first display area DA1 and the second display area DA2 from overflowing into the cutout portion CG. Accordingly, the reliability of the display device 10 may be improved.

The first dam DAM1 and the second dam DAM2 may be disposed on the first planarization layer 150. An etch prevention pattern EST may be further disposed on the first planarization layer 150. The etch prevention pattern EST may be disposed on the driving voltage line VSL, but embodiments are not limited thereto. The etch prevention pattern EST may include an inorganic material, but embodiments are not limited thereto. The etch prevention pattern EST may be disposed around the first dam DAM1 and around the second dam DAM2, and may serve as an etch-stopper in the process of forming the first dam DAM1 and the second dam DAM2. The etch prevention pattern EST may prevent the driving voltage line VSL from being damaged by etching. At least a part of the etch prevention pattern EST may overlap the first dam DAM1 and/or the second dam DAM2 in the thickness direction (e.g., in the third direction DR3).

The first dam DAM1 may include a first sub-dam SDAM1 formed of the same material as the first planarization layer 150, a second sub-dam SDAM2 formed of the same material as the second planarization layer 160, a third sub-dam SDAM3 formed of the same material as the pixel defining layer 180, and a spacer SC. The spacer SC may be integrally formed with the third sub-dam SDAM3, but embodiments are not limited thereto. The first sub-dam SDAM1, the second sub-dam SDAM2, the third sub-dam SDAM3, and the spacer SC may be sequentially stacked.

The second dam DAM2 may include a first sub-dam SDAM1' formed of the same material as the second planarization layer 160, a second sub-dam SDAM2' formed of the same material as the barrier layer 161, and a third sub-dam SDAM3' formed of the same material as the pixel defining layer 180. The spacer SC may be integrally formed with the third sub-dam SDAM3, but embodiments are not limited thereto. The first sub-dam SDAM1', the second sub-dam SDAM2', and the third sub-dam SDAM3' may be sequentially stacked.

In other words, the first dam DAM1 and the second dam DAM2 have substantially the same configuration, and the first dam DAM1 may further include a spacer SC.

The spacer SC may serve to maintain a gap with a structure disposed thereon. For example, when the organic material of the light emitting layer EL is deposited through a fine metal mask, the spacer SC may serve to prevent the sagging of the fine metal mask. In some cases, the spacer SC may serve to support a structure stacked thereon, may serve to maintain a cell gap between the first substrate 101 and the second substrate 102, and may serve to reduce the deformation of the display panel 100 due to stress caused by pressing the display panel 100.

The height h1 of the upper surface of the first dam DAM1 and the height h2 of the upper surface of the second dam Dam2 may be different from each other. In other words, the upper surface of the first dam DAM1 may be located at a position higher than the upper surface of the second dam DAM2 with respect to one surface of the substrate SUB. Alternatively, the upper surface of the first dam DAM1 may be located at a position higher than the upper surface of the second dam DAM2 with respect to the upper surface of the first planarization layer 150. Further, the height h2 of the upper surface of the second dam DAM2 may be substantially the same as the height of the upper surface of the pixel defining layer 180, but embodiments are not limited thereto. The thickness of the first dam DAM1 may be different from the thickness of the second dam DAM2. The thickness of the first dam DAM1 may be thicker than the thickness of the second dam DAM2, but embodiments are not limited thereto.

As the height h1 of the upper surface of the first dam DAM1 is located at a position higher than the height h2 of the upper surface of the second dam DAM2, the second dam DAM2 may suppress or prevent the imprinting caused by a fine metal mask (FMM). For example, the second dam DAM2 may not be damaged by the imprinting of the fine metal mask (FMM). Accordingly, foreign matter or cracks that may be caused by the imprinting caused by the fine metal mask may be suppressed or prevented, and further, the reliability of the display device 10 may be improved.

The first dam DAM1 may overlap the encapsulation organic layer 192 of the thin film encapsulation layer TFEL in the thickness direction (e.g., in the third direction DR3). Specifically, the encapsulation organic layer 192 may include a first organic layer OF1 and a second organic layer OF2. The first organic layer OF1 may be disposed at one side of the second dam DAM2, and may be disposed over the first display area DA1 and the second display area DA2. The second organic layer OF2 may be disposed at the other side of the second dam DAM2, and may be disposed in the third display area DA3. The first organic layer OF1 and the second organic layer OF2 may be spaced apart from each other with the second dam DAM2 interposed therebetween, but, but embodiments are not limited thereto.

The first organic layer OF1 and the second organic layer OF2 may have different thicknesses from each other. The thickness TH1 of the first organic layer OF1 may be greater than the thickness TH2 of the second organic layer OF2. The thickness TH1 of the first organic layer OF1 and the thickness TH2 of the second organic layer OF2 may refer to a thickness between the upper surface of the pixel defining layer 180 and the upper surface of the first organic layer OF1 and a thickness between the upper surface of the defining layer 180 and the upper surface of the second organic layer OF2, respectively. For example, the thickness TH1 of the first organic layer OF1 may be in the range of about 7 μm to about 9 μm, may be in the range of about 6 μm to about 10 μm, or may be about 8 μm, but embodiments are not limited thereto. The thickness TH2 of the second organic layer OF2 may be in the range of about 3 μm to about 5 μm, may be in the range of about 2 μm to about 6 μm, or may be about 4 μm.

Since the first organic layer OF1 disposed in the first display area DA1 and the second display area DA2, which is not generally bent, has a relatively thick thickness, and is disposed in the third display area DA3 that is generally bent as the formed second organic layer OF2 has a relatively thin thickness, and the second organic layer OF2 disposed in the third display area DA3, which is generally bent, has a relatively thin thickness, the first and second pixels PX1 and PX2 disposed in the first and second display areas DA1 and DA2 may be more tightly sealed, and simultaneously, the third pixel PX3 disposed in the third display area DA3 may be sealed, and each cutout pattern CP may more easily bent.

The first organic layer OF1 may cover the entire area of the first dam DAM1. In other words, the first organic layer OF1 may be disposed not only in the first display area DA1 and the second display area DA2, but also in an inter area BTA beyond the first dam DAM1. For example, the first organic layer OF1 may fill the inter area BTA between the first dam DAM1 and second dam DAM2. The first organic layer OF1 may not be disposed in an area beyond the second dam DAM2. For example, the first organic layer OF1 may not be disposed in an inner area surrounded by the second dam DAM2. Further, the second organic layer OF2 may be disposed in the third display area DA3, and may not be disposed in the inter area BTA beyond the second dam DAM2.

In this case, the first organic layer OF1 may overlap the entire area of the first dam DAM1 and may overlap the entire area of the first dam DAM1 in the thickness direction (e.g., in the third direction DR3). The first organic layer OF1 may cover at least a part of the second dam DAM2 and may overlap at least a part of the second dam DAM2 in the thickness direction (e.g., in the third direction DR3). Further, the second organic layer OF2 may cover at least a part of the second dam DAM2 and may overlap at least a part of the second dam DAM2 in the thickness direction (e.g., in the third direction DR3).

Accordingly, since the first dam DAM1 is covered by the encapsulation organic layer 192 and the upper surface of the first dam DAM1 is disposed at a position higher than the upper surface of the second dam DAM2, even when imprinting to the first dam DAM1 is caused by a mask, the first dam DAM1 is covered by the encapsulation organic layer 192, it is possible to suppress or prevent a decrease in reliability due to the first dam DAM1. Thus, the reliability of the display device 10 may be improved.

As the first dam DAM1 is covered by the first organic layer OF1 and the first organic layer OF1 is disposed up to the inter area BTA, the first organic layer OF1 over the first dam DAM1 may have a predetermined thickness. Accordingly, when the sensor electrode layer SENL disposed over the first dam DAM1 senses a touch, the touch sensitivity in the area where the first dam DAM1 is disposed may be improved.

Although it is shown in the drawings that the common electrodes 173' and 173''' are not disposed on the first dam DAM1 and the second dam DAM2, respectively, but embodiments are not limited thereto. For example, the common electrode 173' of the second pixel PX2 may be further disposed on the first dam DAM1, and the common electrode 173' of the second pixel PX2 disposed on the first dam DAM1 may be shorted with the common electrode 173' of the second pixel PX2 disposed on the pixel defining layer 180 of the second display area DA2. Further, the common electrode 173'' of the third pixel PX3 may be further disposed on the second dam DAM2, and the common electrode 173'' of the third pixel PX3 disposed on the second dam DAM2 may be shorted with the common electrode 173'' of the third pixel PX3 disposed on the pixel defining layer 180 of the third display area DA3.

In a cross-sectional view, the first dam DAM1 and the second dam DAM2 may have an under-cut shape. In other words, the side surface of the second sub-dam SDAM2 of the first dam DAM1 may protrude outward from the side surface of the first sub-dam SDAM1 thereof, and the side surface of the second sub-dam SDAM2' of the second dam DAM2 may protrude outward from the side surface of the first sub dam SDAM1' thereof. The side surface of the third sub-dam SDAM3 of the first dam DAM1 may protrude outward from the side surface of the first sub-dam SDAM1 thereof, and the side surface of the third sub-dam SDAM3' of the second dam DAM2 may protrude outward from the side surface of the first sub-dam SDAM1' thereof, but embodiments are not limited thereto.

Since both the first dam DAM1 and the second dam DAM2 have an under-cut shape, when the bending portions SS1, SS2, SS3, and SS4 and the corner portions CS1, CS2, CS3, and CS4 are bent, the adhesion of the encapsulation organic layer 192 may be improved. Accordingly, even when the bending portions SS1, SS2, SS3, and SS4 and the corner portions CS1, CS2, CS3, and CS4 are bent, it is possible to suppress or prevent the encapsulation organic layer 192 from being lifted up, and the reliability of the display device 10 may be improved.

Hereinafter, a method of manufacturing the display device 10 according to an embodiment will be described.

Figure 13:
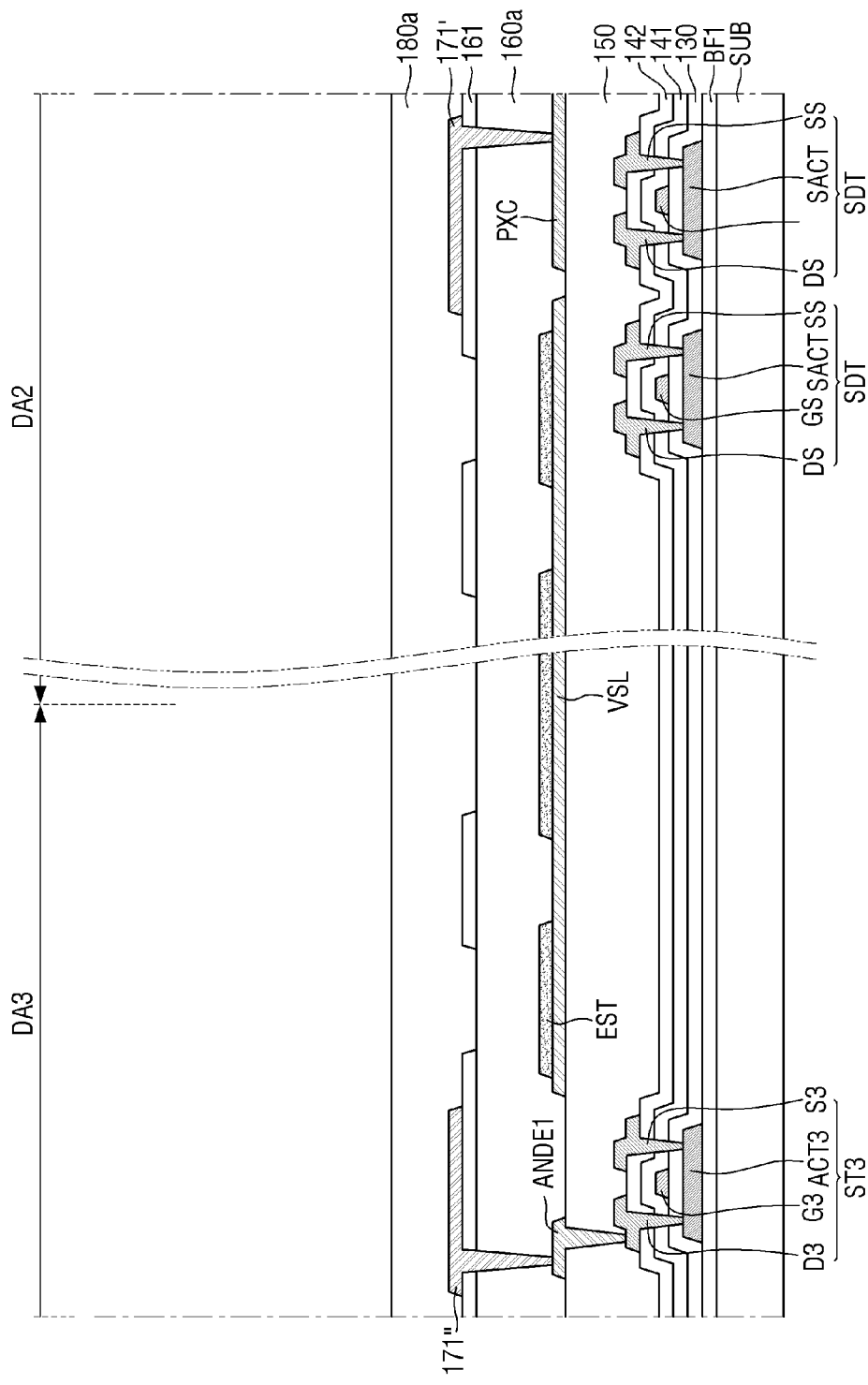
FIGS. 13, 14, and 15 are cross-sectional views illustrating an embodiment of a method of manufacturing the display device of FIG. 1.
Figure 14:
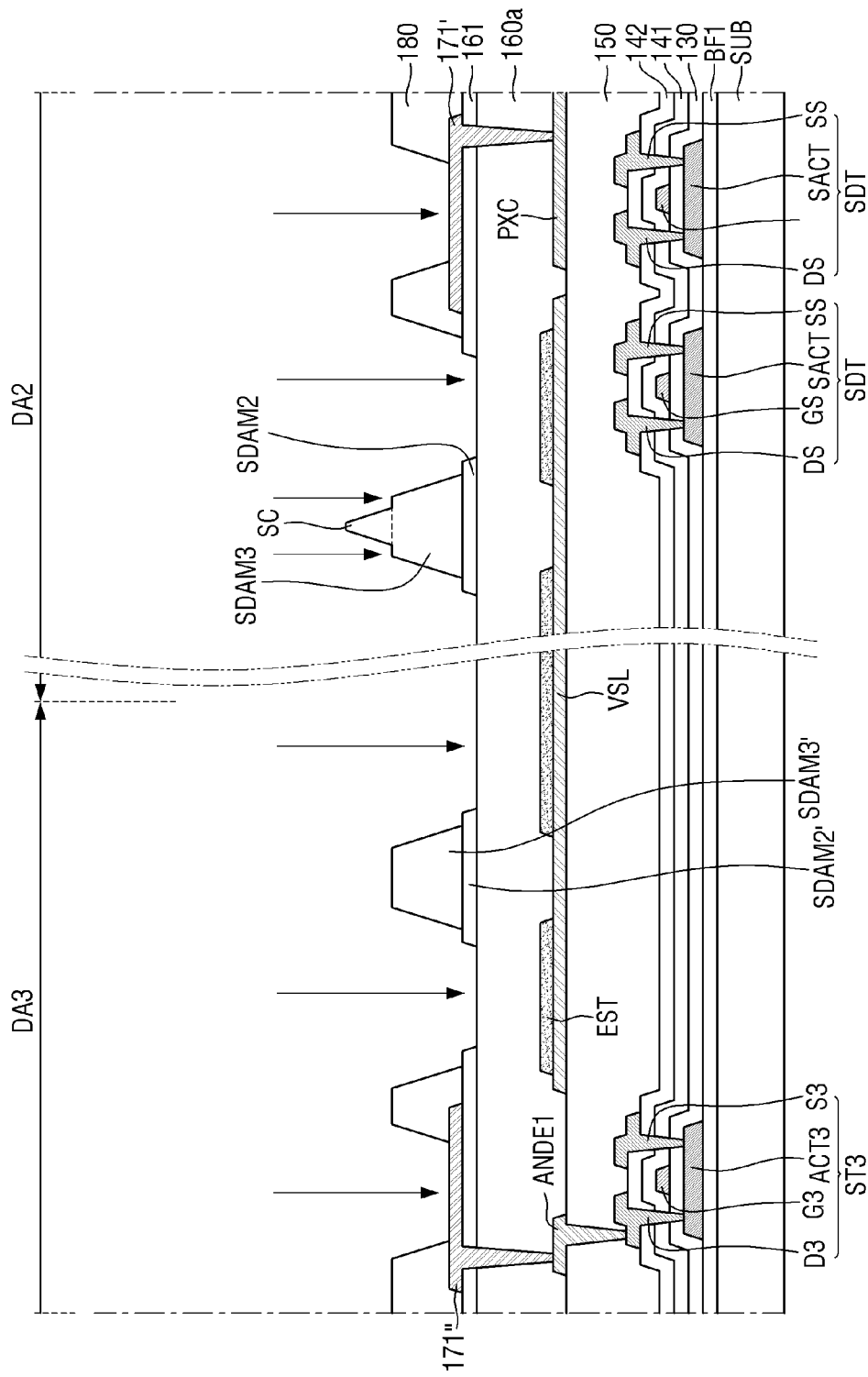
Figure 15:
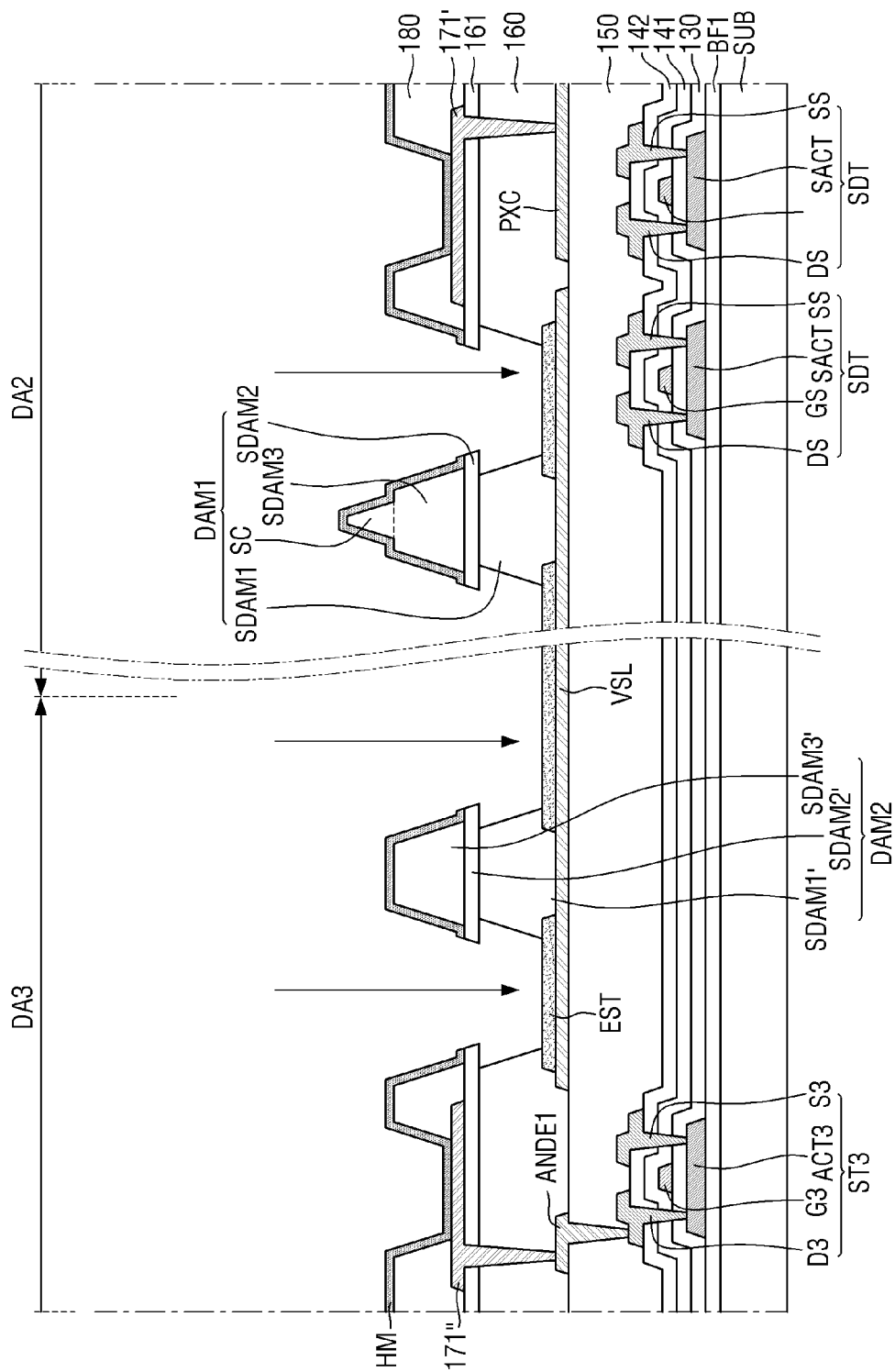

FIGS. 13, 14, and 15 are cross-sectional views illustrating a method of manufacturing a display device according to an embodiment.

First, referring to FIG. 13, a third thin film transistor ST3 and a scan driving transistor SDT are formed on a substrate SUB, and a first planarization layer 150 covering the third thin film transistor ST3 and the scan driving transistor SDT is formed. Although it is shown in the drawings that only the third thin film transistor ST3 and the scan driving transistor SDT are formed, but embodiments are not limited thereto, and a first thin film transistor ST1 (refer to FIG. 6) and a second thin film transistor ST2 (refer to FIG. 10) may be formed together with the third thin film transistor ST3 and the scan driving transistor SDT.

Thereafter, a driving voltage line VSL, a first connection electrode ANDE1, an etch prevention pattern EST, and a pixel connection line PXC are formed on the first planarization layer 150. In this case, the etch prevention pattern EST may be patterned. Accordingly, out-gassing may be easily performed in the first planarization layer 150, and thus the reliability of the display device 10 may be improved.

Thereafter, a material layer 160a for a second planarization layer is formed on the driving voltage line VSL, the first connection electrode ANDE1, the etch prevention pattern EST, and the pixel connection line PXC. The material layer 160a for a second planarization layer may cover the first connection electrode ANDE1, the etch prevention pattern EST, and the pixel connection line PXC, and may be formed over the entire area of the substrate.

Thereafter, second sub-dams SDAM2 and SDAM2', a barrier layer 161, and pixel electrodes 171' and 171" are formed on the material layer 160a for a second planarization layer. In this case, the second sub-dams SDAM2 and SDAM2' and the barrier layer 161 may include substantially the same material, and may be patterned. Accordingly, out-gassing may be easily performed in the material layer 160a for a second planarization layer, and thus the reliability of the display device 10 may be improved.

Thereafter, a material layer 180a for a pixel defining layer 180 is formed on the barrier layer 161 and the pixel electrodes 171' and 171". The material layer 180a for the pixel defining layer 180 may cover the barrier layer 161 and the pixel electrodes 171' and 171", and may be formed over the entire area of the substrate.

Thereafter, referring to FIG. 14, the material layer 180a for the pixel defining layer 180 is patterned. The material layer 180a for the pixel defining layer 180 may include, for example, an organic material including a photosensitive material. In this case, the patterned sub-dams SDAM2, SDAM3, SDAM2' and SDAM3' and the spacers SC may be formed by exposing and developing the material layer 180a for the pixel defining layer 180. The material layer 180a of the pixel defining layer 180 may form structures having different heights through exposure and development.

Specifically, the spacer SC and the third sub-dam SDAM3 and SDAM3' are formed by exposing and developing the material layer 180a for the pixel defining layer 180, and a half-tone mask may be used during the exposure process. The material layer 180a for the pixel defining layer 180 may be exposed through a half-tone mask, and degree of exposure may be different for each region of the material layer 180a for the pixel defining layer 180. Accordingly, the material layer 180a for the pixel defining layer 180 may form regions having different heights in the second display area DA2. For example, the spacer SC may be formed on the third sub-dam SDAM3 of the second display area DA2, and may not be formed on the third sub-dam SDAM3' of the third display area DA3. Accordingly, according to processes to be described later, the upper surface of the first dam DAM1 (refer to FIG. 9) and the upper surface of the second dam DAM2 (refer to FIG. 9) may have different heights based on the substrate SUB.

Further, when patterning the material layer 180a for the pixel defining layer 180, parts of the side surfaces of the second sub-dams SDAM2 and SDAM2' may be exposed. The side surfaces of the second sub-dams SDAM2 and SDAM2' may protrude outward from the side surfaces of the third sub-dams SDAM3 and SDAM3'.

Thereafter, referring to FIG. 15, a second planarization layer 160 and first sub-dams SDAM1 and SDAM1' are formed by patterning a material layer 160a for a second planarization layer.

Specifically, a patterned hard mask HM is formed on the patterned sub-dams SDAM2, SDAM3, SDAM2', and SDAM3' and the spacer SC, and the material layer 160a for the second planarization layer is etched using the hard mask HM as an etching mask. The material layer 160a for the second planarization layer to be etched may overlap an area in which the etch prevention pattern EST is disposed. In other words, the hard mask HM may be patterned to expose the underlying etch prevention pattern EST, and the material layer 160a for the second planarization layer may be etched using the hard mask HM to pattern the material layer 160a for the second planarization layer.

The first DAM1 and the second dam DAM2 may have an under-cut shape due to the etch prevention pattern EST disposed under the material layer 160a for the second planarization layer.

Hereinafter, other embodiments will be described. In the following embodiments, for the same components as those previously described, redundant descriptions will be omitted or simplified, and differences will be mainly described.

Figure 16:
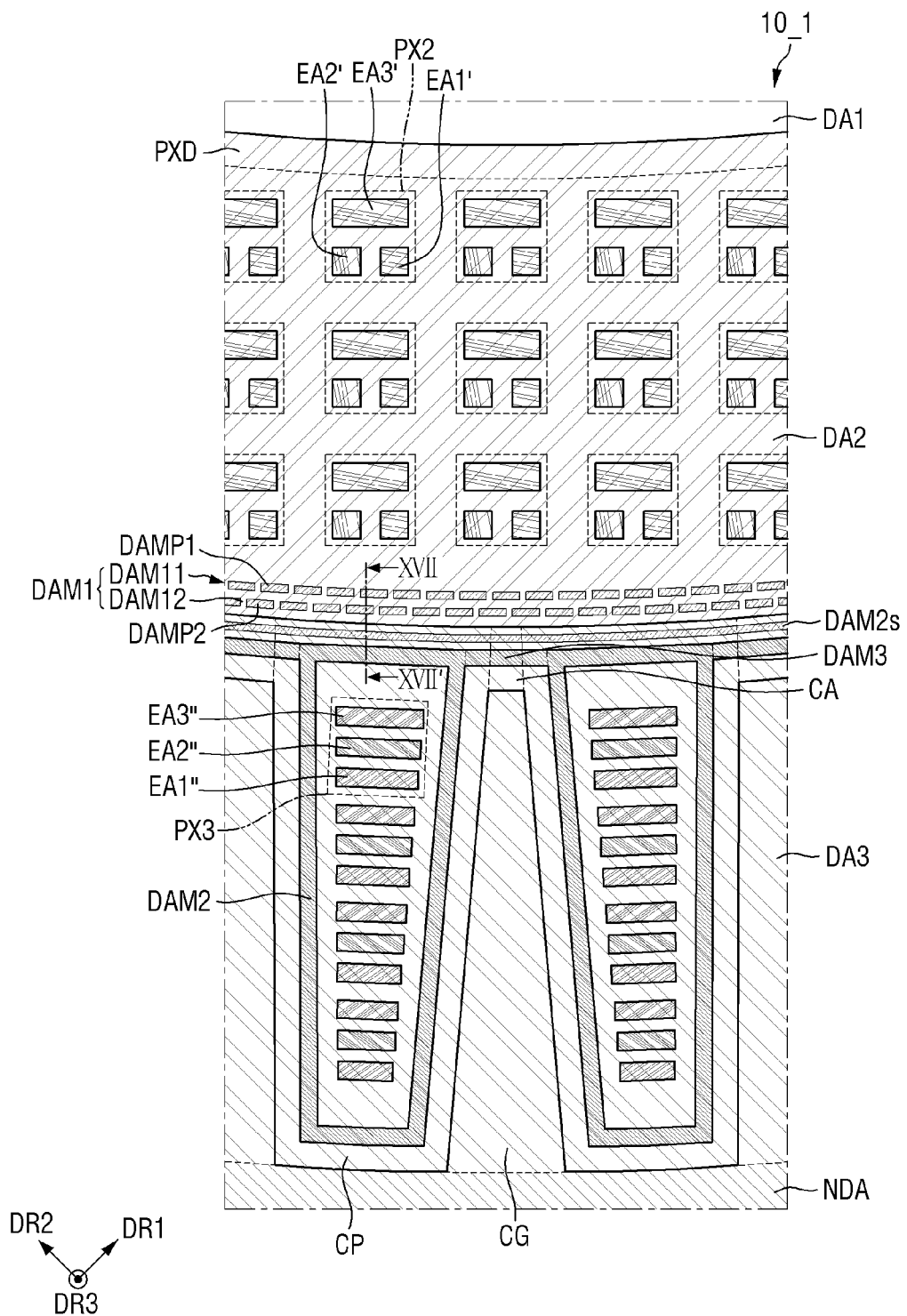
FIG. 16 is an enlarged view of a part of the plan view of another embodiment of the display device of FIG. 1.
Figure 17:
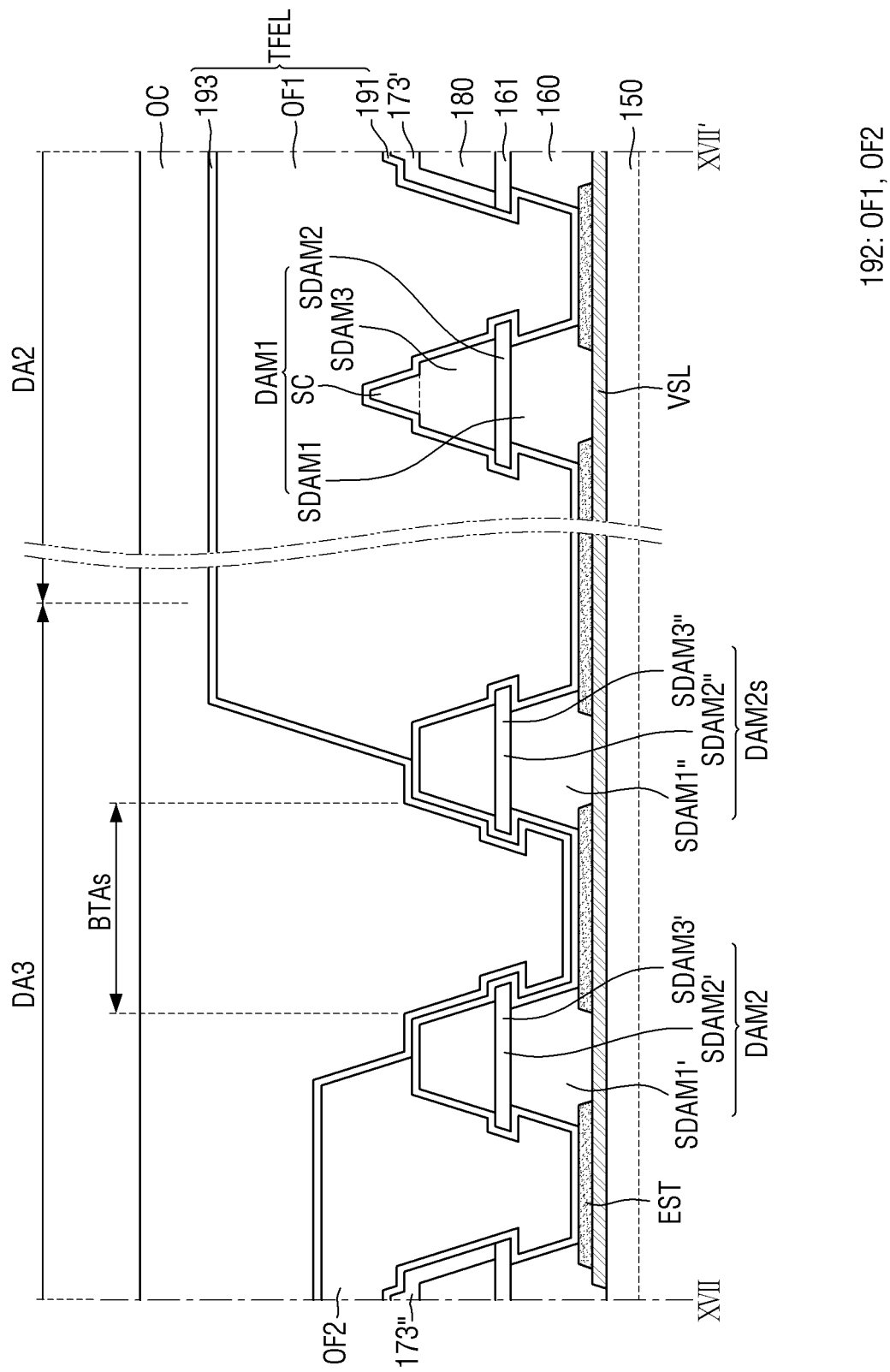
FIG. 17 is a cross-sectional view taken along the line XVII-XVII' of FIG. 16.

FIG. 16 is an enlarged view of a part of the plan view of a display device according to another embodiment. FIG. 17 is a cross-sectional view taken along the line XVII-XVII' of FIG. 16.

Referring to FIGS. 16 and 17, a display device 10_1 according to an embodiment different from the display device 10 according to the embodiments of FIGS. 8 and 9 in that it further includes a second sub-dam DAM2s.

Specifically, the display device 10_1 according to the embodiment may further include a second sub-dam DAM2s. The second sub-dam DAM2s may be disposed in the third display area DA3, but embodiments are not limited thereto. For example, the second sub-dam DAM2s may be disposed in the second display area DA2 or may be disposed in the non-display area NDA. The second sub-dam DAM2s may be disposed between the first dam DAM1 and the second dam DA2. The second sub-dam DAM2s may be integrally formed. The second sub-dam DAM2s may cover the side surfaces of the second dam DAM2 and the connection dam DAM3.

Based on one surface of the substrate SUB, the height of the upper surface of the second sub-dam DAM2s may be substantially the same as the height of the upper surface of the second dam DAM2. Based on one surface of the substrate SUB, the height of the upper surface of the second sub-dam DAM2s may be lower than the height of the upper surface of the first dam DAM1.

The first organic layer OF1 of the encapsulation organic layer 192 may be disposed up to the second sub-dam DAM2s beyond the first dam DAM1. The first organic layer OF1 may not be disposed in an area beyond the second sub-dam DAM2s. The second organic layer OF2 may not be disposed in an area beyond the second dam DAM2. Accordingly, the encapsulation organic layer 192 may not be disposed in a sub-inter area BTAs between the second dam DAM2 and the second sub-dam DAM2s.

In this case, the second dam DAM2 and the second sub-dam DAM2s may suppress or prevent the imprinting by a fine metal mask (FMM), and the first dam DAM1 may be covered by the encapsulation organic layer 192 even when imprinting occurs by the fine metal mask. Further, since the second sub-dam DAM2s is further disposed between the second dam DAM2 and the first dam DAM1, the overflow of the encapsulation organic layer 192 may be prevented more easily, and the reliability of the display device 10_1 may be further improved.

Figure 18:
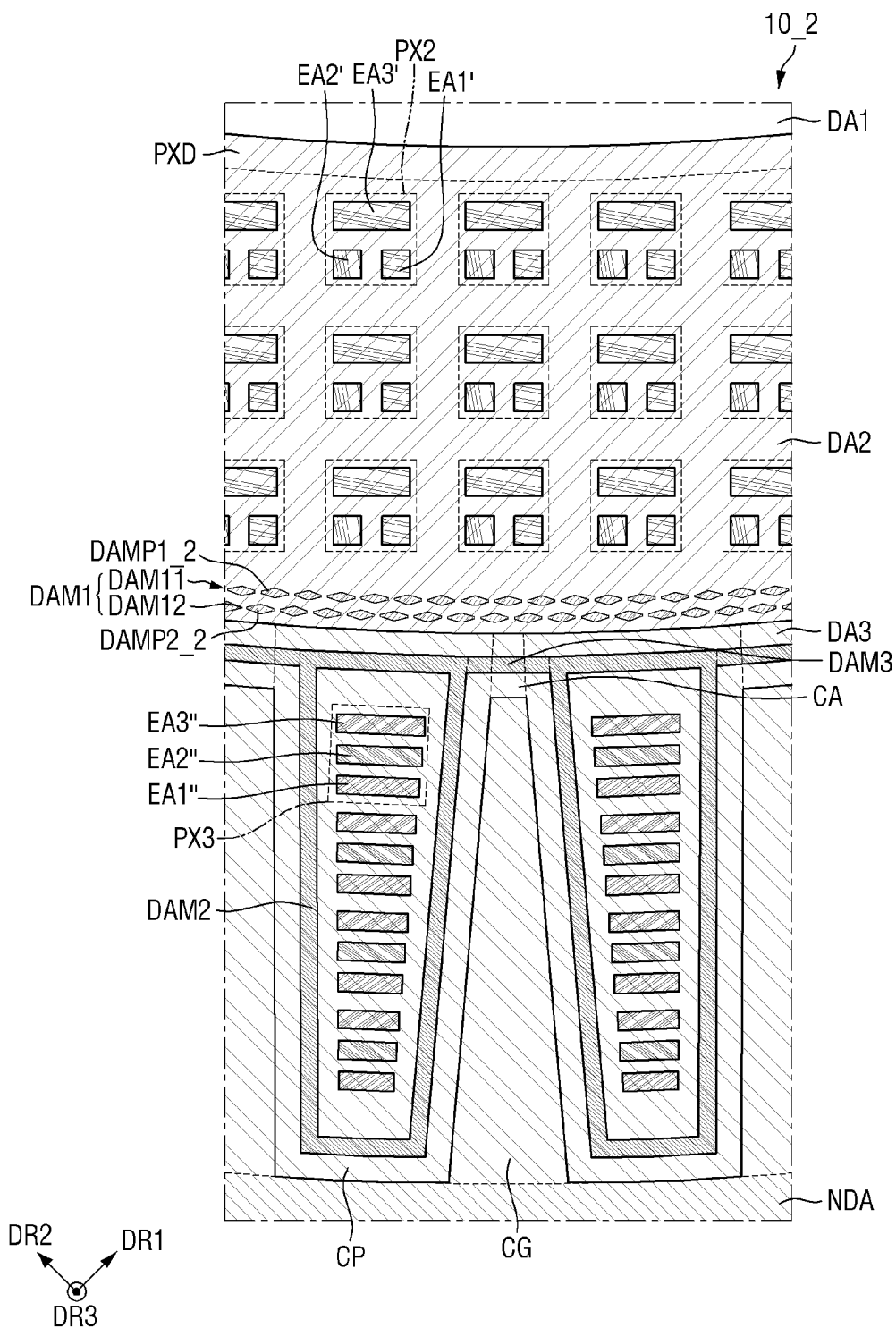
FIG. 18 is an enlarged view of a part of the plan view of another embodiment of the display device of FIG. 1.

FIG. 18 is an enlarged view of a part of the plan view of a display device according to another embodiment.

Referring to FIG. 18, a display device 10_2 according to an embodiment is different from the display device 10 according to the embodiment of FIG. 8 in that, in a plan view, each unit pattern DAMP1_2 or DAMP2_2 of the first dam DAM1 of the display device 10_2 may have various shapes without having a rectangular shape in a plan view.

Specifically, in a plan view, each of the unit patterns DAMP1_2 and DAMP2_2 of the first dam DAM1 of the display device 10_2 according to an embodiment may have various shapes. For example, in a plan view, each of the unit patterns DAMP1_2 and DAMP2_2 may have a hexagonal shape. In this case, an axis in a direction in which the respective unit patterns DAMP1_2 and DAMP2_are arranged may be longer than an axis in a direction perpendicular thereto, but embodiments are not limited thereto.

Even in this case, the flow of the encapsulation organic layer 192 or the first organic layer OF1 flowing from the first display area DA1 and the second display area DA2 to the third display area DA3 may be controlled by a capillary phenomenon between the unit patterns DAMP1_1 and DAMP2_2. Further, depending on the properties of the encapsulation organic layer 192 or the first organic layer OF1 and/or the degree of bending of the second display area DA2 and the third display area DA3, each of the unit patterns DAMP1_2 and DAMP2_2 controlling the flow of the organic layer OF1 may have various planar shapes.

Figure 19:
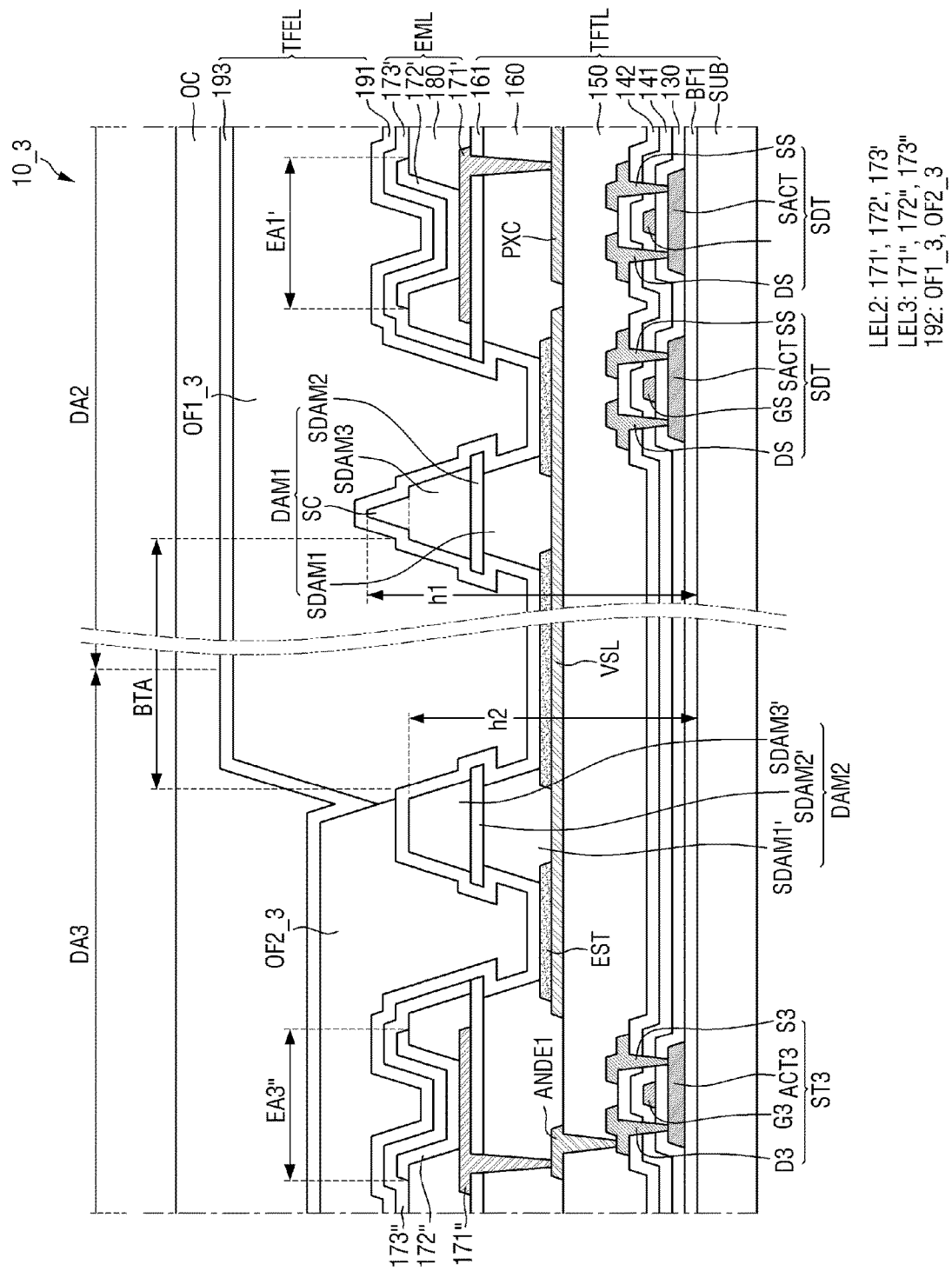
FIG. 19 is a cross-sectional view of another embodiment of the display device of FIG. 1.

FIG. 19 is a cross-sectional view of a display device according to another embodiment.

Referring to FIG. 19, a display device 10_3 according to an embodiment is different from the display device 10 according to the embodiment of FIG. 9 in that the first organic layer OF1_3 and second organic layer OF2_3 of the encapsulation organic layer 192 of the display device 10_3 may directly contact each other.

Specifically, the first organic layer OF1_3 and second organic layer OF2_3 of the encapsulation organic layer 192 according to an embodiment may directly contact each other in at least some areas. The first organic layer OF1_3 and second organic layer OF2_3 of the encapsulation organic layer 192 may directly contact each other in the second dam DAM2, and may overlap each other in the thickness direction. For example, the first organic layer OF1_3 may be disposed on the second organic layer OF2_3, but embodiments are not limited thereto.

Although it is shown in FIG. 19 that first organic layer OF1_3 and second organic layer OF2_3 of the encapsulation organic layer 192 are distinguished from each other in an area where they directly contact each other, and overlap each other in the thickness direction, and the first organic layer OF1_3 and the second organic layer OF2_3 may directly contact each other to be mixed, and a physical boundary may not exist, but embodiments are not limited thereto.

In this case, the second dam DAM2 may suppress or prevent the imprinting caused by a fine metal mask (FMM), and the first dam DAM1 may be covered by the encapsulation organic layer 192 even when imprinting occurs by the fine metal mask.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
a display panel having a front portion, a first bending portion extending from a first side of the front portion, a second bending portion extending from a second side of the front portion, and a corner portion disposed between the first bending portion and the second bending portion, the display panel comprising a plurality of first pixels disposed in the front portion and a plurality of second pixels disposed in the corner portion,
wherein the display panel comprising:
a substrate;
a first dam disposed on the substrate and surrounding the plurality of first pixels; and
a second dam disposed on the substrate and surrounding the plurality of second pixels,
wherein the substrate comprises a plurality of cutout patterns disposed in the corner portion, at least some of the plurality of cutout patterns being separated from each other,
the plurality of second pixels and the second dam are disposed in each of the plurality of cutout patterns, and
a height of an upper surface of the first dam is higher than a height of an upper surface of the second dam, based on one surface of the substrate.

2. The display device of claim 1, wherein the first dam comprises a plurality of first unit patterns and a plurality of second unit patterns, and wherein:
the plurality of first unit patterns are repeatedly arranged and spaced apart from each other, and
the plurality of second unit patterns are repeatedly arranged and spaced apart from each other.

3. The display device of claim 2, wherein the plurality of first unit patterns and the plurality of second unit patterns are arranged in substantially parallel.

4. The display device of claim 3, wherein each of the first unit patterns and the second unit patterns has a rectangular shape or a hexagonal shape.

5. The display device of claim 2, further comprising a connection dam disposed on the substrate and connecting the second dam respectively disposed in the plurality of cutout patterns.

6. The display device of claim 1, further comprising an organic encapsulation layer comprising:
- a first organic layer disposed on the plurality of first pixels and covering the plurality of first pixels, and
- a second organic layer disposed on the plurality of second pixels and covering the plurality of second pixels,
- wherein the first organic layer overlaps the first dam and the second dam.

7. The display device of claim 6, wherein the first organic layer covers an entire area of the first dam, and fills an area between the first dam and the second dam.

8. The display device of claim 7, wherein a thickness of the first organic layer is greater than a thickness of the second organic layer.

9. The display device of claim 8, wherein the thickness of the first organic layer is in a range of about 7 µm to about 9 µm, and the thickness of the second organic layer is in a range of about 3 µm to about 5 µm.

10. The display device of claim 1, wherein each of the first dam and the second dam has an under-cut shape.

11. The display device of claim 1, wherein:
- the first bending portion has a first curvature,
- the second bending portion has a second curvature, and
- the corner portion has a double curvature bent by the first curvature and the second curvature.

12. The display device of claim 11, wherein the first curvature is different from the second curvature.

13. A display device, comprising:
- a display panel having a front portion, a first bending portion extending from a first side of the front portion, a second bending portion extending from a second side of the front portion, and a corner portion disposed between the first bending portion and the second bending portion, the display panel comprising a plurality of first pixels disposed in the front portion and a plurality of second pixels disposed in the corner portion,
- wherein the display panel comprises:
- a substrate;
- a first dam disposed on the substrate and surrounding the plurality of first pixels;
- a second dam disposed on the substrate and surrounding the plurality of second pixels; and
- an organic encapsulation layer comprising a first organic layer disposed on the plurality of first pixels and covering the plurality of first pixels, and a second organic layer disposed on the plurality of second pixels and covering the plurality of second pixels,
- wherein the substrate comprises a plurality of cutout patterns disposed in the corner portion and at least some thereof being separated from each other,
- the plurality of second pixels and the second dam are disposed in each of the cutout patterns, and
- the first organic layer overlaps the first dam and the second dam.

14. The display device of claim 13, wherein the first organic layer covers an entire area of the first dam, and fills an area between the first dam and the second dam.

15. The display device of claim 14, wherein a thickness of the first organic layer is in a range of about 7 µm to about 9 µm, and a thickness of the second organic layer is in a range of about 3 µm to about 5 µm.

16. The display device of claim 13, wherein a height of an upper surface of the first dam is higher than a height of an upper surface of the second dam, based on one surface of the substrate.

17. The display device of claim 16, wherein the first dam comprises a plurality of first unit patterns and a plurality of second unit patterns, and wherein:
- the plurality of first unit patterns are repeatedly arranged, and
- the plurality of second unit patterns are repeatedly arranged.

18. The display device of claim 17, further comprising a connection dam disposed on the substrate and connecting the second dam respectively disposed in the plurality of cutout patterns.

19. A display device, comprising:
- a substrate having a base portion and a plurality of cutout patterns protruding from the base portion;
- a plurality of first pixels disposed on the base portion;
- a plurality of second pixels disposed in each of the cutout patterns;
- a first dam disposed on the base portion and surrounding the plurality of first pixels; and
- a second dam disposed in each of the plurality of cutout patterns and surrounding the plurality of second pixels,
- wherein a height of an upper surface of the first dam is higher than a height of an upper surface of the second dam, based on one surface of the substrate.

20. The display device of claim 19, further comprising an organic encapsulation layer comprising:
- a first organic layer disposed on the plurality of first pixels and covering the plurality of first pixels, and
- a second organic layer disposed on the plurality of second pixels and covering the plurality of second pixels,
- wherein the first organic layer overlaps the first dam and the second dam.

* * * * *